(12) United States Patent
Sakai

(10) Patent No.: US 10,897,185 B2
(45) Date of Patent: Jan. 19, 2021

(54) ELECTRIC DEVICE AND ELECTRIC DEVICE MANUFACTURING METHOD

(71) Applicant: DENSO CORPORATION, Kariya (JP)

(72) Inventor: Koji Sakai, Kariya (JP)

(73) Assignee: DENSO CORPORATION, Kariya (JP)

( * ) Notice: Subject to any disclaimer, the term of this patent is extended or adjusted under 35 U.S.C. 154(b) by 972 days.

(21) Appl. No.: 15/514,060

(22) PCT Filed: Oct. 6, 2015

(86) PCT No.: PCT/JP2015/005076
§ 371 (c)(1),
(2) Date: Mar. 24, 2017

(87) PCT Pub. No.: WO2016/059771
PCT Pub. Date: Apr. 21, 2016

(65) Prior Publication Data
US 2017/0302139 A1     Oct. 19, 2017

(30) Foreign Application Priority Data

Oct. 16, 2014 (JP) .................................. 2014-211947

(51) Int. Cl.
| | |
|---|---|
| *H02K 11/33* | (2016.01) |
| *H02K 11/30* | (2016.01) |
| *F04B 39/00* | (2006.01) |
| *H02K 15/00* | (2006.01) |
| *F04B 35/04* | (2006.01) |

(Continued)

(52) U.S. Cl.
CPC .............. *H02K 11/33* (2016.01); *F04B 35/04* (2013.01); *F04B 39/00* (2013.01); *F04C 29/047* (2013.01); *H02K 9/19* (2013.01); *H02K 11/30* (2016.01); *H02K 15/00* (2013.01); *H05K 7/20354* (2013.01); *H05K 7/20881* (2013.01); *F04C 23/008* (2013.01); *F04C 29/0085* (2013.01); *F04C 2240/803* (2013.01);

(Continued)

(58) Field of Classification Search
CPC .......... H02K 11/33; H02K 11/30; H02K 9/19; H02K 15/00
USPC ........................................................ 310/54
See application file for complete search history.

(56) References Cited

U.S. PATENT DOCUMENTS

| | | | | |
|---|---|---|---|---|
| 5,924,192 A | * | 7/1999 | Wuyts | ................ H05K 13/0812 29/833 |
| 8,242,648 B2 | * | 8/2012 | Mizutani | ................ H02K 11/38 310/68 B |

(Continued)

FOREIGN PATENT DOCUMENTS

| | | | | |
|---|---|---|---|---|
| JP | H02088464 U | | 7/1990 | |
| JP | 9245864 | * | 9/1997 | ............. H01R 13/03 |

(Continued)

*Primary Examiner* — Terrance L Kenerly
(74) *Attorney, Agent, or Firm* — Harness, Dickey & Pierce, P.L.C.

(57) ABSTRACT

An electric device includes a case, an electric component that is provided in the case and has a main body section and a lead terminal extending from the main body section, the main body section being supported on the case, a circuit board that is provided in the case and has a connecting hole through which the lead terminal is inserted, and a guide member that has a guide hole positioned relative to the connecting hole, the lead terminal being disposed to penetrate through the guide hole.

14 Claims, 11 Drawing Sheets

(51) Int. Cl.
*F04C 29/04* (2006.01)
*H02K 9/19* (2006.01)
*H05K 7/20* (2006.01)
*H02K 9/22* (2006.01)
*H02K 15/12* (2006.01)
*F04C 23/00* (2006.01)
*F04C 29/00* (2006.01)
*F04D 25/06* (2006.01)

(52) U.S. Cl.
CPC ............ *F04D 25/0693* (2013.01); *H02K 9/22* (2013.01); *H02K 15/12* (2013.01)

(56) References Cited

U.S. PATENT DOCUMENTS

| | | | |
|---|---|---|---|
| 2003/0143090 | A1 | 7/2003 | Iritani et al. |
| 2011/0285226 | A1* | 11/2011 | Fujita ................ H01L 24/49 |
| | | | 310/71 |
| 2013/0187490 | A1 | 7/2013 | Hennecke et al. |
| 2015/0285249 | A1* | 10/2015 | Nagaoka ............ F04C 18/0215 |
| | | | 417/410.5 |

FOREIGN PATENT DOCUMENTS

| | | | | |
|---|---|---|---|---|
| JP | 2003222078 | A | | 8/2003 |
| JP | 2004335894 | A | | 11/2004 |
| JP | 2010251487 | | * 11/2010 | ............... H02K 1/18 |
| JP | 2013537396 | A | | 9/2013 |
| JP | 2014090043 | A | | 5/2014 |

* cited by examiner

US 10,897,185 B2

ELECTRIC DEVICE AND ELECTRIC DEVICE MANUFACTURING METHOD

CROSS REFERENCE TO RELATED APPLICATIONS

This application is a U.S. National Phase Application under 35 U.S.C. 371 of International Application No. PCT/JP2015/005076 filed on Oct. 6, 2015 and published in Japanese as WO 2016/059771 A1 on Apr. 21, 2016. This application is based on and claims the benefit of priority from Japanese Patent Application No. 2014-211947 filed on Oct. 16, 2014. The entire disclosures of all of the above applications are incorporated herein by reference.

TECHNICAL FIELD

The present disclosure relates to an electric device in which a lead terminal of an electric component supported on a case is inserted in a connecting hole of a circuit board, and a manufacturing method of the same.

BACKGROUND ART

One conventional art example is an electric device that drives an electric compressor as disclosed in Patent Literature 1 listed below. In the electric device, a main body section of a relatively large electric component is secured to the case. A lead terminal extending from the main body section of the electric component is connected to a circuit board disposed inside the case.

PRIOR ART LITERATURES

Patent Literature

Patent Literature 1: JP-2003-222078A

SUMMARY OF INVENTION

The inventor found out a problem by the detailed investigation that, when an attempt is to be made to reduce the size of the electric device of the conventional art example, it is difficult to connect the electric component to the circuit board if the dimensional tolerances of the components or assembly tolerances remain unchanged. More specifically, the inventor found out a problem that the lead terminal extending from the main body section of the electric component supported on the case is hardly inserted into a connecting hole of the circuit board.

An object of the present disclosure is to provide an electric device that allows easy insertion of a lead terminal of an electric component whose main body section is supported on a case into a connecting hole of a circuit board, and a manufacturing method of the electric device.

According to a first aspect of the present disclosure, the electric device includes a case, an electric component that is provided in the case and has a main body section and a lead terminal extending from the main body section, the main body section being supported on the case, a circuit board that is provided in the case and has a connecting hole through which the lead terminal is inserted, and a guide member that has a guide hole positioned relative to the connecting hole, the lead terminal being disposed to penetrate through the guide hole.

Thus, when the lead terminal of the electric component whose main body section is supported on the case is inserted into the connecting hole of the circuit board, the lead terminal can be guided by the guide hole that has been positioned relative to the connecting hole of the circuit board. Therefore, the lead terminal of the electric component whose main body section is supported on the case can be inserted easily into the connecting hole of the circuit board.

According to a second aspect of the present disclosure, a method for manufacturing an electric device including a case, an electric component that is provided in the case and has a main body section and a lead terminal extending from the main body section, the main body section being supported on the case, and a circuit board that is provided in the case and has a connecting hole through which the lead terminal is inserted includes a positioning step of preparing a guide member having a guide hole and positioning the guide hole relative to the connecting hole, a terminal insertion step of guiding the lead terminal with the guide hole and inserting the lead terminal into the connecting hole after the positioning step, a supporting step of attaching the main body section to the case and supporting the main body section on the case, and a board placement step of placing the circuit board in the case after the positioning step.

Thus, when the lead terminal of the electric component whose main body section is supported on the case in the supporting step is inserted into the connecting hole of the circuit board in the terminal insertion step, the lead terminal can be guided by the guide hole of the guide member that has been positioned relative to the connecting hole of the circuit board in the positioning step. Therefore, the lead terminal of the electric component whose main body section is supported on the case can be inserted easily into the connecting hole of the circuit board in the terminal insertion step.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

Figure 1:
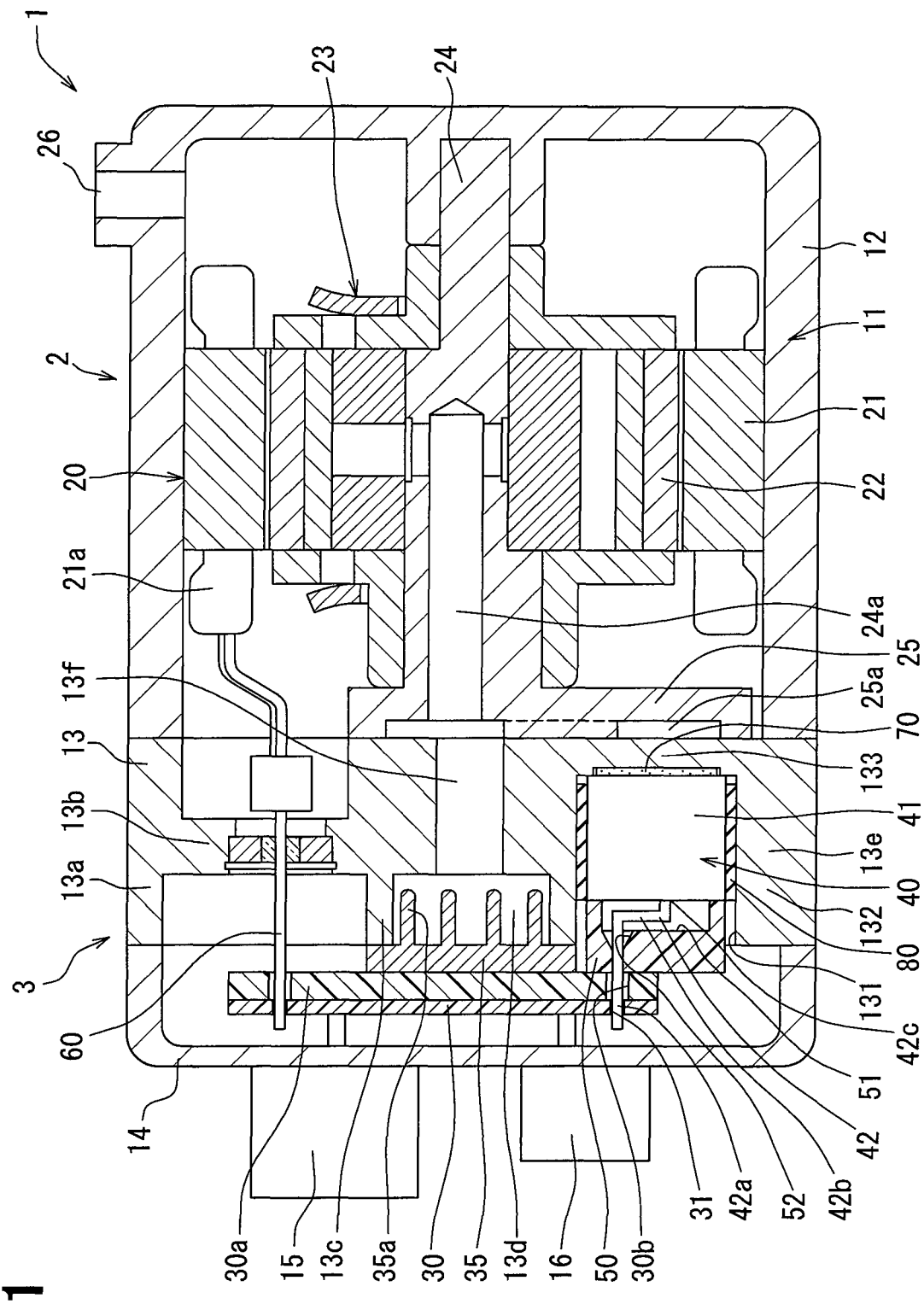
FIG. 1 is a cross-sectional view illustrating a schematic configuration of an electric compressor that includes the electric device according to a first embodiment to which the present disclosure is applied.

Embodiments of the present disclosure will be described hereafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

A first embodiment to which the present disclosure is applied will be described with reference to FIG. 1 to FIG. 13.

As shown in FIG. 1, the electric device to which the present disclosure is applied is provided in an electric compressor 1. The electric compressor 1 of the present embodiment includes an electric compressor section 2 and a drive circuit section 3 that drives the electric compressor section 2. The drive circuit section 3 corresponds to the electric device in the present embodiment. The electric compressor 1 is mounted in a vehicle, for example, and compresses and discharges a refrigerant that circulates in a refrigeration cycle of a vehicle air-conditioning device.

The electric compressor 1 includes a housing 11 as an outer case. The housing 11 includes a motor housing 12 that is a first case body, an inverter housing 13 that is a second case body, and a cover 14 that is a third case body.

The motor housing 12 is made of metal, for example, and formed in a bottomed cylindrical shape. Inside the motor housing 12 is provided a motor 20 that is an electric motor and a compression mechanism 23. The motor 20 includes a stator 21 and a rotor 22. Inside the motor housing 12 is provided the stator 21 that is a static part along the inner circumferential surface of the cylindrical part. The stator 21 has a coil 21a, which is configured by a core of a soft magnetic material, for example, and a conductive having an insulation coating and wound around the core.

Inside the stator 21 is provided the rotor 22 that is a rotating part, which is rotated by rotating magnetic fields generated when power is supplied to the coil 21a of the stator 21. The rotor 22 is configured by a permanent magnet, for example. A shaft 24 extending along an axial direction is disposed in a central part inside the motor housing 12. The compression mechanism 23 is set around the shaft 24. The compression mechanism 23 is provided integrally with the rotor 22 of the motor 20. The rotor 22 and the compression mechanism 23 rotate integrally and together form one rotating body. The shaft 24 is a fixed support member that supports the rotating body.

A refrigerant passage 24a extending along the axial direction is formed inside the shaft 24. The downstream end of the refrigerant passage 24a can communicate with a compression chamber of the compression mechanism 23. An enlarged passage forming section 25 is provided on one end of the shaft 24 facing the drive circuit section 3. The enlarged passage forming section 25 is formed integrally with the shaft 24. The enlarged passage forming section 25 forms a refrigerant passage 25a that extends in a radial direction of the housing 11 between the enlarged passage forming section 25 and the inverter housing 13. The refrigerant passage 25a communicates with the upstream end of the refrigerant passage 24a.

The space inside the motor housing 12 is a discharge chamber into which the refrigerant that has been compressed by the compression mechanism 23 in the operating chamber is discharged. The motor housing 12 has a discharge port 26 near the bottom of the cylindrical part, for example. The discharge port 26 discharges the high pressure refrigerant discharged into the discharge chamber is expelled to a refrigerant circulating passage of the refrigeration cycle device. While the compression mechanism 23 in the example here is a rotary compression mechanism, it is not limited to this type. The compression mechanism may be a reciprocal compression mechanism, for example.

The inverter housing 13 is made of metal, for example, and mounted to close the opening on the opposite side from the bottom of the motor housing 12, which is formed in a bottomed cylindrical shape. The inverter housing 13 and the cover 14 forms a housing space for a circuit board 30 therebetween. The inverter housing 13 is provided to separate the discharge chamber of the high pressure refrigerant and the housing space for the circuit board.

The inverter housing 13 includes an outer tube 13a, a partition 13b, a circuit setting part 13c, a bottomed cylindrical part 13e, and so on. The outer tube 13a is connected to an end face of the cylindrical part of the motor housing 12. A through hole is formed in the partition 13b that is provided inside the outer tube 13a, and a through hole terminal 60 is disposed inside the through hole. The through hole terminal 60 electrically connects the coil 21a and the circuit board 30 while maintaining isolation between the discharge chamber and the circuit board housing space. The through hole terminal 60 is connected to the coil 21a with a connector, for example, while part of the through hole terminal 60 positioned inside the through hole is soldered to a conductive pattern on the circuit board 30.

The circuit setting part 13c that protrudes toward the opposite side from the electric compressor is provided in a central portion of the partition 13b. The circuit board 30 is set on an end face of the circuit setting part 13c on the opposite side from the electric compressor, via a heat dissipating component 35. A refrigerant passage 13d is formed inside the circuit setting part 13c. The refrigerant passage 13d communicates with the refrigerant circulating passage of the refrigeration cycle device so that a low pressure refrigerant flows from the refrigeration cycle device through an inlet port in the inverter housing 13.

The heat dissipating component 35 is an aluminum alloy member with high heat conductivity, for example, and includes heat dissipating fins 35a on the surface that faces the refrigerant passage 13d. A communication passage 13f that connects the refrigerant passage 13d and the refrigerant passage 25a is formed inside the circuit setting part 13c.

In the partition 13b, for example, on the opposite side from the through hole terminal installation position across the axis line is provided the bottomed cylindrical part 13e. The bottomed cylindrical part 13e has therein a housing recess 131, which is recessed from the opposite side from the electric compressor. The bottomed cylindrical part 13e includes a tubular part 132 and a bottom part 133 that closes the end face of the tubular part 132 facing the electric compressor. The housing recess 131 is open on the opposite side from the bottom part of the tubular part 132.

The housing recess 131 accommodates therein a main body section 41 of an electric component 40. The housing recess 131 is a recess slightly larger than the outer shape of the main body section 41. The main body section 41 has a rectangular parallelepiped shape, for example. Accordingly, the housing recess 131 has a similar rectangular parallelepiped shape. The tubular part 132 in the example here is square cylindrical having a rectangular inner circumferential surface. The cross-sectional shape orthogonal to the axis line of the housing recess 131 is not limited to rectangular. The cross-sectional shape may be circular, for example.

The electric component 40 has a lead terminal 42 extending from the main body section 41. The housing recess 131 is open on the side on which the lead terminal 42 extends from the main body section 41 accommodated in the housing recess 131. The electric component 40 is an electrical filtering component, for example. The electric component 40 is a filtering circuit component provided in a power feed system for an inverter circuit provided on the circuit board 30, for example. The electric component 40 may be at least one of a capacitor element or a coil element, for example.

Part of the tubular part 132 of the bottomed cylindrical part 13e is commonly used as part of the circuit setting part 13c on the side facing the housing recess 131. Therefore, the refrigerant passage 13d and the communication passage 13f are disposed to extend along the outer surface of the tubular part 132. The refrigerant passage 25a is disposed to extend along the bottom part 133 of the bottomed cylindrical part 13e. Thus the main body section 41 accommodated in the housing recess 131 is cooled by the refrigerant flowing through the refrigerant passage 13d, the communication passage 13f, and the refrigerant passage 25a and sucked in by the compression mechanism 23. The sucked-in refrigerant is a coolant that cools the main body section 41.

A heat dissipating grease 70 and a hardening resin 80 are provided between the inner face of the housing recess 131 and the main body section 41. A filling recess 134 is formed in the surface of the bottom part 133 facing the housing recess 131, and the filling recess 134 is filled with the heat dissipating grease 70. The heat dissipating grease 70 is made of silicone, for example, containing additives such as metal or ceramic particles, and reduces heat resistance between the main body section 41 and the bottom part 133.

Figure 12:
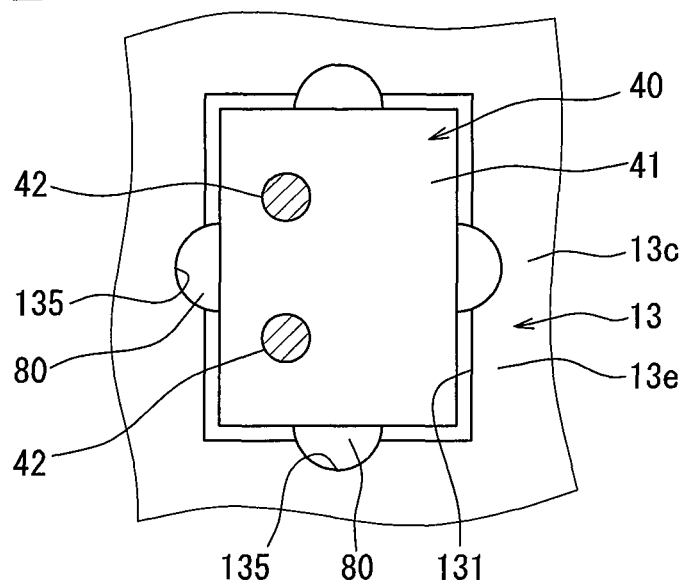
FIG. 12 is a diagram of a housing recess for accommodating the main body section of the electric component in the first embodiment viewed from the open side.

The hardening resin 80 is provided between the inner circumferential surface of the housing recess 131 and the main body section 41. As shown in FIG. 12, injection recesses 135 extending in the depth direction of the housing recess 131 may be formed in each inner circumferential surface of the housing recess 131 that is rectangular tubular. The injection recesses 135 may be grooves having a semicircular cross-sectional shape, for example. Hardening resin having fluidity may be injected into the injection recesses 135 and hardened after that. With this, the hardening resin 80 can be disposed between the inner circumferential surface of the housing recess 131 and the main body section 41. The hardening resin 80, which is a hardening resin member, is a rubber member made by hardening a liquid adhesive rubber made of silicone, for example, as well as a flexible member capable of deflection after being hardened.

The main body section 41 is accommodated inside the housing recess 131 and supported by the inverter housing 13 via the heat dissipating grease 70 and the hardening resin 80. The main body section 41 may partly be supported directly on the bottom part 133.

The lead terminal 42 extends from the main body section 41. The lead terminal 42 has a connecting portion 42a that is disposed inside a through hole 31 of the circuit board 30 and electrically connects to a conductive circuit. The lead terminal 42 includes a bent portion 42b between the connecting portion 42a at the distal end and a proximal part 42c closer to the main body section 41. The bent portion 42b in the example is bent at right angles at two points in opposite directions to have a crank-like shape. The bent portion 42b is a bent-shaped, stress-mitigating part.

The circuit board 30 has an insulating base material and a conductive pattern. The insulating base material of the circuit board 30 is made of epoxy resin containing glass fiber, for example. The through hole 31 is formed in the insulating base material as a connecting hole, so that a terminal or the like inserted in the through hole 31 is soldered, for example, for electrical connection with the conductive pattern. The circuit board 30 extends in a direction orthogonal to the axis line of the housing 11. The circuit board 30 is disposed in the space formed between the inverter housing 13 and the cover 14. The inverter housing 13 and the cover 14 correspond to a case that has the circuit board 30 therein in the present embodiment.

The circuit board 30 in the example includes an element molded part 30a. The element molded part 30a is formed by molding a power element such as a switching element with resin, for example. Epoxy resin having high heat conductivity may be used as the molding resin, for example. The molded power element constitutes a heat generating element that generates a relatively large amount of heat. The element molded part 30a corresponds to a heat generating component mounted on the circuit board 30.

The switching element that is a heat generating element is an IGBT (Insulated Gate Bipolar Transistor) or the like, for example. The switching element may alternatively be an RCIGBT (Reverse Conducting Insulated Gate Bipolar Transistor) or the like, which is a power semiconductor having an IGBT and a reverse conducting diode integrated on one chip. The switching element configures part of an inverter circuit that is a drive circuit formed on the circuit board 30 and drives the motor 20.

The element molded part 30a mounted on the circuit board 30 is in tight contact with the heat dissipating component 35. The circuit board 30 is disposed to adjoin the circuit setting part 13c of the inverter housing 13 via the heat dissipating component 35. The element molded part 30a that is a heat generating component is cooled by the refrigerant sucked in and flowing through the refrigerant passage 13d via the heat dissipating component 35. The molding resin of the element molded part 30a can be considered as part of the insulating base material of the circuit board 30. In this respect, the circuit board 30 can be considered as an element-containing substrate having the switching element built inside the insulating base material. The circuit board 30 is disposed to cover part of the opening of the housing recess 131 on the opposite side from the bottom part, where the main body section 41 of the electric component 40 is accommodated.

A guide component 50 that is a guide member is provided between the circuit board 30 and the main body section 41 of the electric component 40. The guide component 50 is positioned between the circuit board 30 and the main body section 41 in the axial direction of the housing 11. The guide component 50 is made of a resin material having a relatively high rigidity, good heat resistance, and electrical insulation properties, for example.

Figure 11:
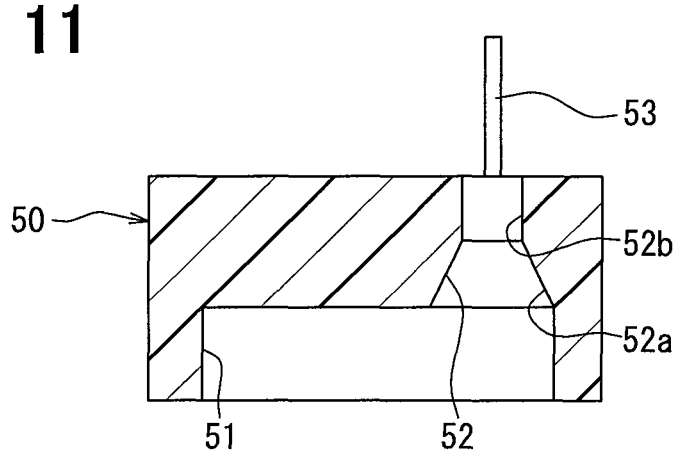
FIG. 11 is a cross-sectional view illustrating a schematic configuration of a guide member in the first embodiment.

The guide component 50 has a recess 51 and a guide hole 52, as shown in FIG. 1 and FIG. 11. The recess 51 is recessed from the opposite side from the circuit board of the guide component 50. The recess 51 is formed to accommodate therein the bent portion 42b of the lead terminal 42 so as not to interfere with the bent portion 42b. The guide hole 52 is formed to penetrate through the guide component 50 along the axial direction of the housing 11.

The guide hole 52 has a tapered portion 52a and a straight portion 52b. The tapered portion 52a is closer to the side opposite from the circuit board than the straight portion 52b is. The tapered portion 52a has a tapered surface with the radius reducing from the main body section 41 of the electric component 40 toward the through hole 31 of the circuit board 30. One end of the guide hole 52 on the opposite side from the circuit board opens in the bottom surface of the recess 51. In the example, part of the tapered portion 52a with a largest diameter opens in the bottom surface of the recess 51.

The tapered portion 52a and the straight portion 52b are formed coaxial with each other. The tapered portion 52a and the straight portion 52b have the same diameter in a connecting portion therebetween. That is, the smallest diameter of the tapered portion 52a on the side facing the circuit board is equal to the diameter of the straight portion 52b at the end on the opposite side from the circuit board. The diameter of the straight portion 52b at the end on the opposite side from the circuit board may be slightly larger than the diameter of the tapered portion 52a on the side facing the circuit board.

One end of the guide hole 52 on the side facing the circuit board opens in the surface of the guide component 50 on the side facing the circuit board. In the example, one end of the straight portion 52b on the side facing the circuit board opens in the surface of the guide component 50 on the side facing the circuit board. The diameter at one end of the guide hole 52 on the side facing the circuit board is slightly smaller than the diameter of the through hole 31 of the circuit board 30 corresponding to the guide hole 52.

The guide component 50 includes fixing pins 53. The fixing pin 53 is a metal pin member, for example, and protrudes from the surface of the main body of the guide component 50 on the side facing the circuit board. The fixing pin 53 is set inside a through hole provided to the circuit board 30, for example, and secured to the circuit board 30 by soldering or the like. The fixing pin 53 is a fixed part of the guide component 50 secured to the circuit board 30. The through hole in which the fixing pin 53 is inserted is formed at a position different from that of the through hole 31, which is a connecting hole for the lead terminal 42.

In the example, the surface of the guide component 50 facing the circuit board makes contact with the element molded part 30a of the circuit board 30. A through hole 30b is formed in the element molded part 30a at the position corresponding to the through hole 31. The through hole 30b is formed to penetrate through the element molded part 30a in the thickness direction. The diameter of the through hole 30b is larger than the diameter of the through hole 31 and the diameter of the straight portion 52b of the guide hole 52.

As shown in FIG. 1, when the element molded part 30a is mounted as a heat generating component on the circuit board 30, the heat generating component is mounted on one side of the circuit board 30 on which the main body section 41 is disposed. The element molded part 30a when mounted has a lower height than the electric component 40. The element molded part 30a and the main body section 41 of the electric component 40 are cooled by the refrigerant flowing through the refrigerant passage 13d, the communication passage 13f, and the refrigerant passage 25a and sucked in by the compression mechanism 23. That is, the element molded part 30a that is a heat generating component, and the main body section 41 of the electric component 40 are cooled by the same coolant.

The cover 14 can be made of resin or metal, for example. The cover 14 has a relatively shallow bottomed tubular shape and is connected to the end face of the outer tube 13a of the inverter housing 13 on the opposite side from the electric compressor. The cover 14 includes a first connector 15 and a second connector 16. The first connector 15 is a power supply connector that supplies high voltage power of, for example, 280 V from outside. The second connector 16 is a power supply connector that supplies low voltage power of, for example, 12 V from outside. Respective terminals of the first connector 15 and the second connector 16 extending into the housing 11 are electrically connected to the conductive pattern of the circuit board 30.

Figure 2:
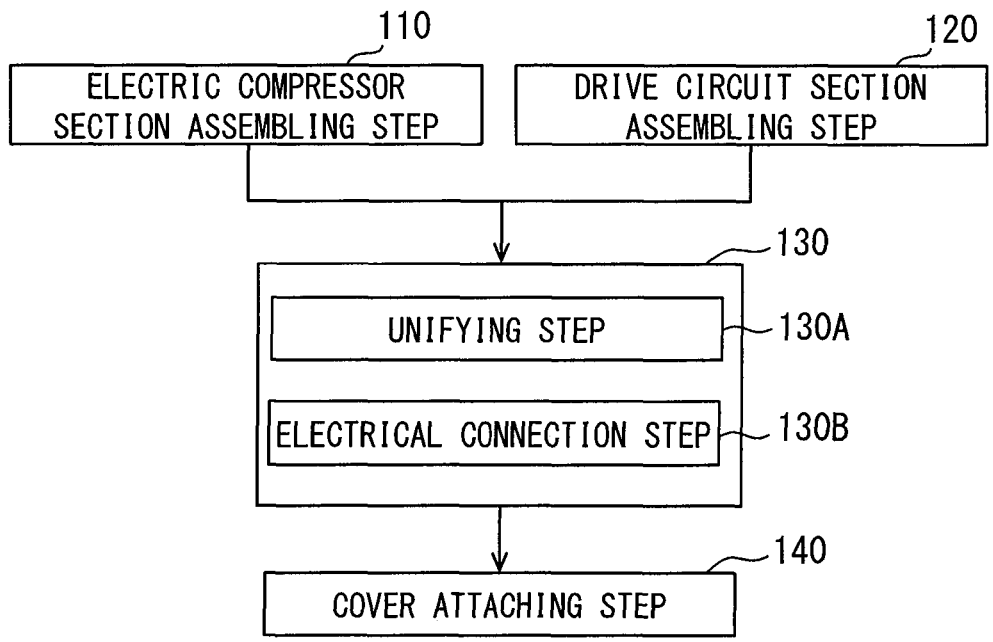
FIG. 2 is a process flowchart showing the schematic manufacturing process of the electric compressor.

The electric compressor 1 configured as described above is manufactured according to the process flow illustrated in FIG. 2. First, a step denoted at 110 of assembling the electric compressor section is performed. In 110, the motor 20, the compression mechanism 23, the shaft 24, and others are assembled into the motor housing 12 to obtain the electric compressor section 2. Meanwhile, separately from 110, a step denoted at 120 of assembling the drive circuit section is performed. In 120, the circuit board 30, the heat dissipating component 35, the electric component 40, the guide component 50, the through hole terminal 60, and others are assembled into the inverter housing 13 to obtain the drive circuit section 3 without the cover 14.

After 110 and 120 have been performed, a step denoted at 130 is performed. In 130, a unifying step denoted at 130A and an electrical connection step denoted at 130B are performed. In 130A, the inverter housing 13 with various components mounted thereon is attached to the motor housing 12 to mechanically join the electric compressor section 2 obtained in 110 and the drive circuit section 3 obtained in 120. In 130B, the electric compressor section 2 obtained in 110 and the drive circuit section 3 obtained in 120 are electrically connected to each other. More specifically, the through hole terminal 60 and the coil 21a are connected with a connector, while the motor 20 and the circuit board 30 are electrically connected via the through hole terminal 60.

After 130 has been performed, a step denoted at 140 of attaching a cover section is performed. In 140, the cover 14 is attached to the drive circuit section 3 that does not have the cover 14. The respective terminals of the first connector 15 and the second connector 16 are electrically connected to the circuit board 30.

Next, the step of assembling the drive circuit section denoted at 120 will roughly be described with reference to the process flow illustrated in FIG. 3 and cross-sectional views of respective process steps shown in FIG. 4 to FIG. 10. The heat dissipating component 35, the through hole terminal 60, and the refrigerant passages, and so on are not shown in FIG. 4 to FIG. 10.

Figure 3:
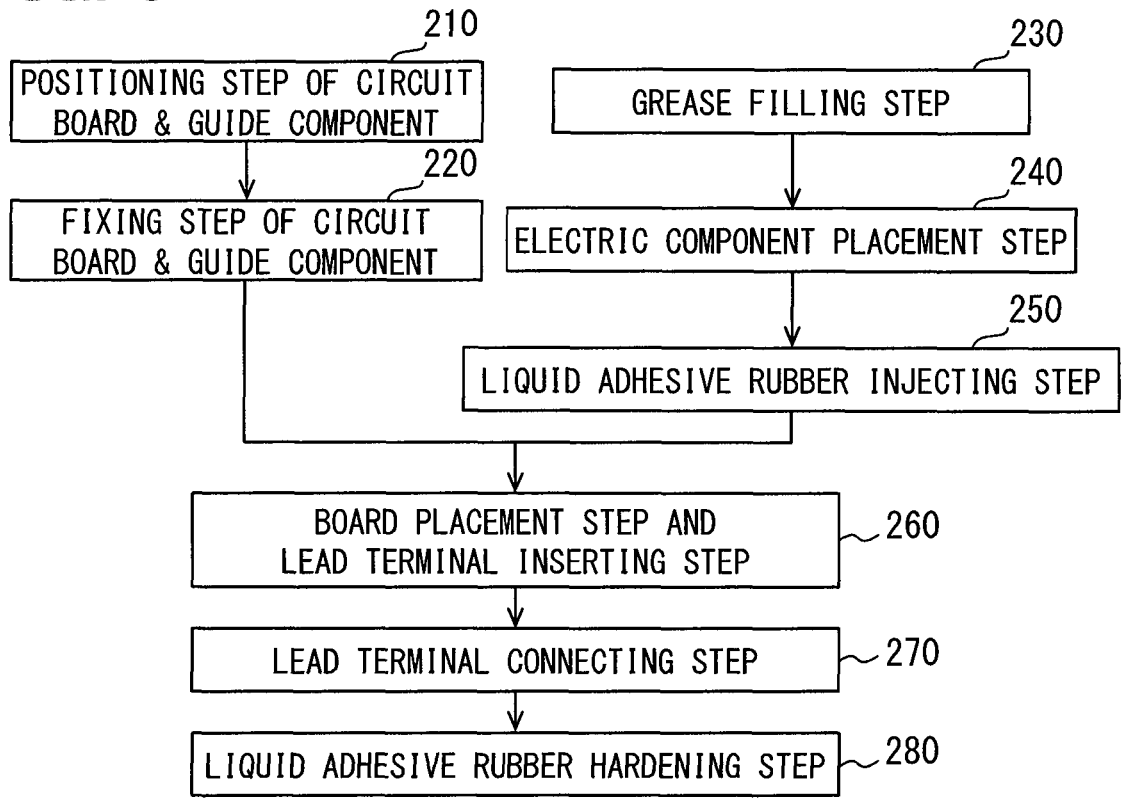
FIG. 3 is a process flowchart showing the schematic manufacturing process of a drive circuit section in the first embodiment.
Figure 4:
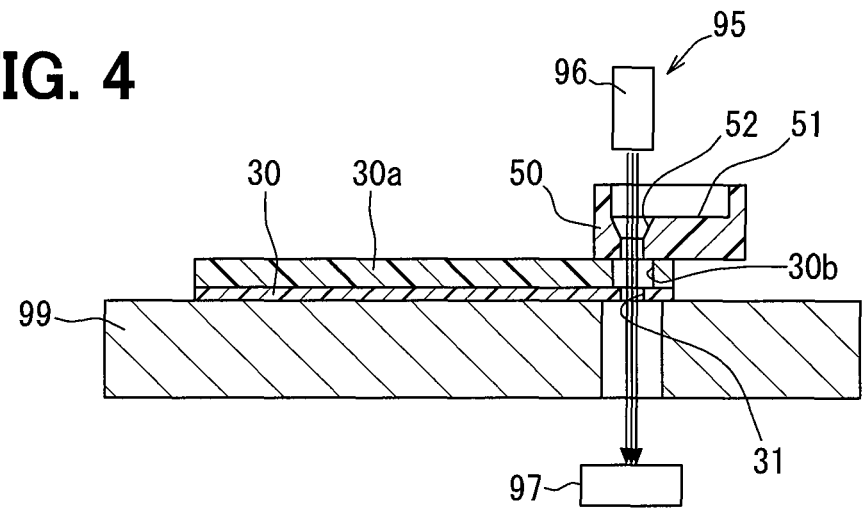
FIG. 4 is part of a cross-sectional view of one process step of forming the drive circuit section of the first embodiment.

In 210 shown in FIG. 3, a positioning step of the circuit board 30 and the guide component 50 is performed. In 210, the guide hole 52 of the guide component 50 is positioned relative to the through hole 31 of the circuit board 30. As shown in FIG. 4, in 210, first, the circuit board 30 and the guide component 50 are placed one after another on a base 99 of an optical positioning device 95. Next, a laser beam is emitted from a laser emitting unit 96 disposed on the same side as the guide component 50, and the laser beam that has passed through both of the guide hole 52 and the through hole 31 is received by a light receiving unit 97.

The light receiving unit 97 determines the matching degree between the axis lines of the guide hole 52 and the through hole 31 in accordance with the amount or shape of received laser light. An actuator of the optical positioning device 95 then adjusts the position of the guide component 50 relative to the circuit board 30 so that the matching degree between the axis lines of the guide hole 52 and the through hole 31 is increased to substantially maximum. The guide hole 52 is positioned relative to the through hole 31 in this way. 210 corresponds to the positioning step in the present embodiment.

While the positioning of the guide hole 52 relative to the through hole 31 is based on the amount or shape of the received laser light, the method is not limited to this. For example, in addition to at least one of these, the position of the guide hole 52 may be determined by image recognition with the use of a camera or the like. Alternatively, for example, the position of the guide hole 52 relative to the through hole 31 may be determined by image recognition alone with the use of a camera or the like. Various optical positioning devices can be effectively used for the positioning of the guide hole 52 relative to the through hole 31.

Figure 5:
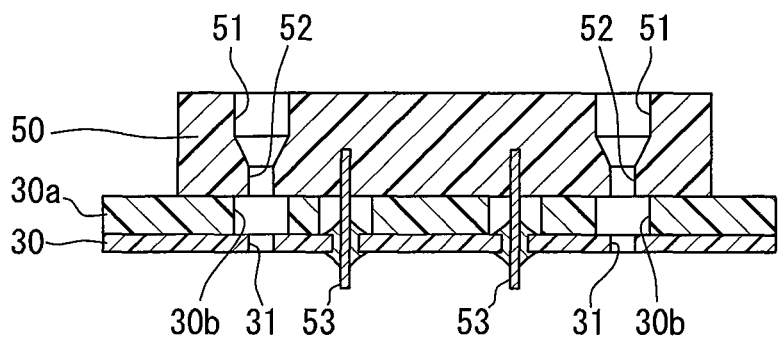
FIG. 5 is part of a cross-sectional view of one process step of forming the drive circuit section of the first embodiment.

After performing 210, the fixing step of the circuit board 30 and the guide component 50 is performed at 220. As shown in FIG. 5, in 220, the fixing pins 53 of the guide component 50 set inside the through holes of the circuit board 30 are soldered to the circuit board 30. Thus the guide component 50 is secured to the circuit board 30 at the fixed parts. 220 corresponds to the fixing step in the present embodiment.

Figure 6:
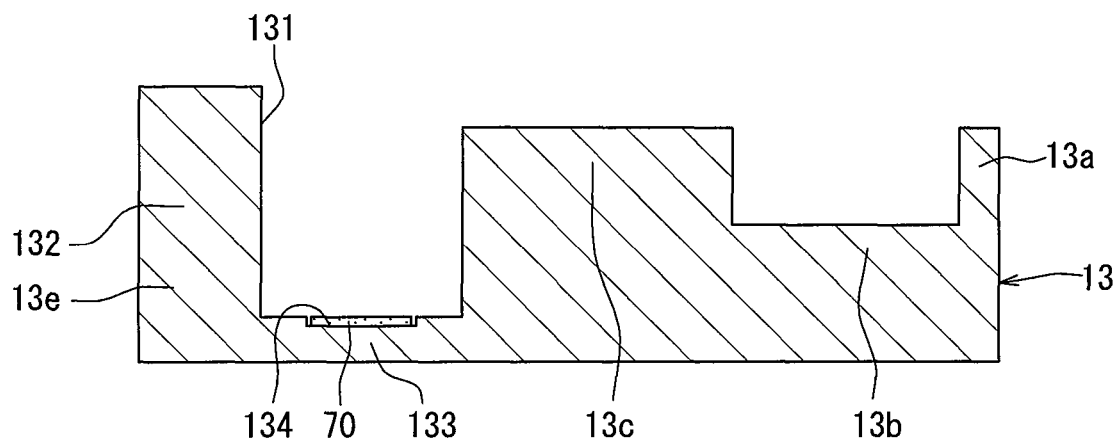
FIG. 6 is part of a cross-sectional view of one process step of forming the drive circuit section of the first embodiment.

Separately from 210 and 220, a grease filling step denoted at 230 is performed. As shown in FIG. 6, in 230, the filling recess 134 formed in the bottom surface of the housing recess 131 of the inverter housing 13 is filled with the heat dissipating grease 70.

Figure 7:
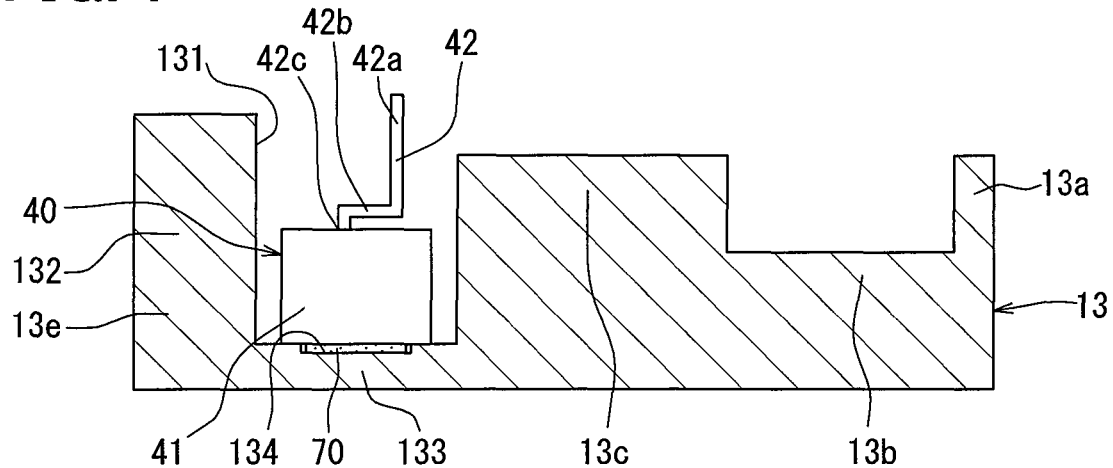
FIG. 7 is part of a cross-sectional view of one process step of forming the drive circuit section of the first embodiment.

After performing 230, a step of placing the electric component 40 is performed at 240. As shown in FIG. 7, in 240, the main body section 41 of the electric component 40 is disposed inside the housing recess 131 of the inverter housing 13. The main body section 41 is disposed substantially in the center of the housing recess 131 when viewed from the open side of the housing recess 131. The bottom surface of the main body section 41 makes tight contact with the heat dissipating grease 70 inside the filling recess 134 at this time.

Figure 8:
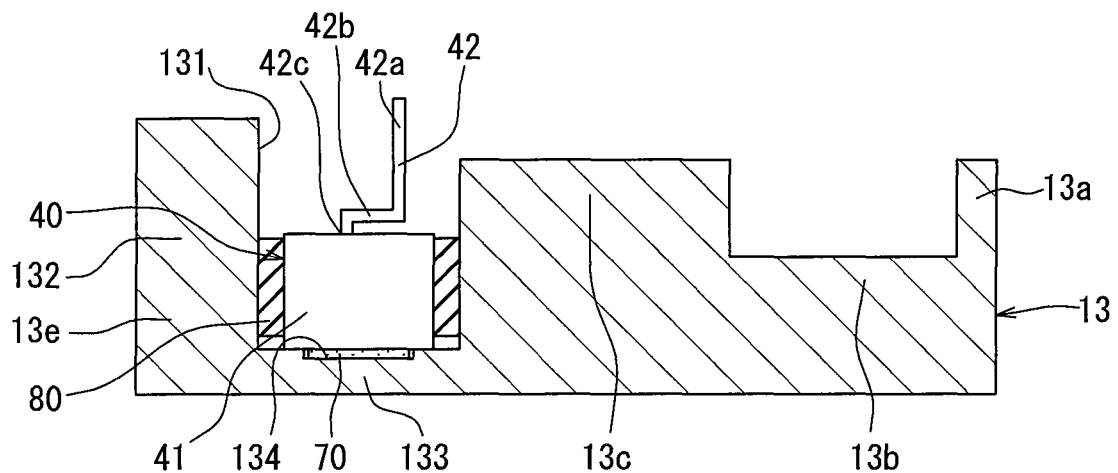
FIG. 8 is part of a cross-sectional view of one process step of forming the drive circuit section of the first embodiment.

After performing 240, a step of injecting liquid adhesive rubber is performed at 250. As shown in FIG. 8, in 250, the hardening resin 80 having fluidity before the hardening is injected into between the inner circumferential surface of the housing recess 131 and the main body section 41. The tip of a dispenser is inserted into the injection recesses 135 shown in FIG. 12, and the liquid adhesive rubber is injected into the injection recesses 135 from the tip of the dispenser. The injected liquid adhesive rubber makes tight contact with the inner circumferential surface of the housing recess 131 and the outer circumferential surface of the main body section 41. 250 corresponds to the injection step in the present embodiment.

Figure 9:
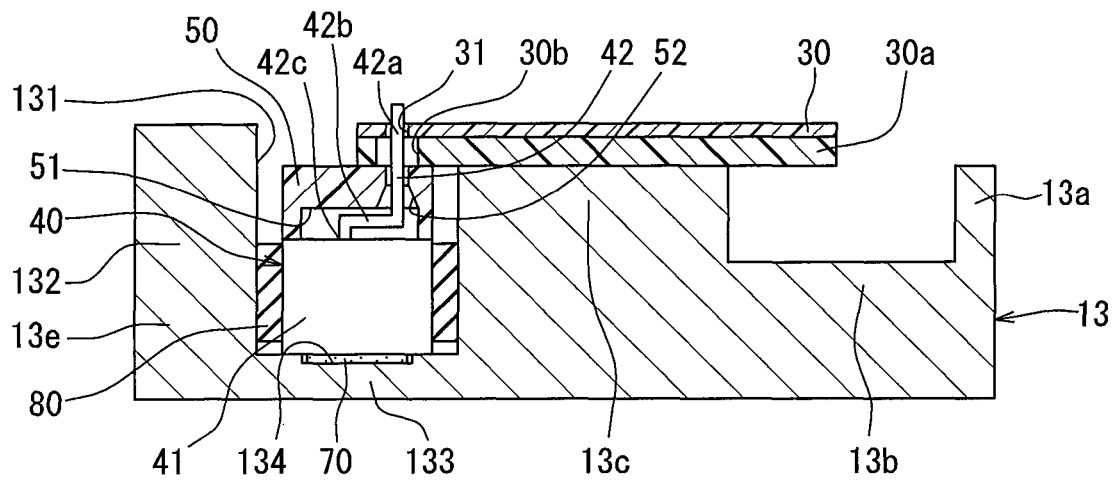
FIG. 9 is part of a cross-sectional view of one process step of forming the drive circuit section of the first embodiment.

After performing 220 and 250, a step of placing a board and a step of inserting a lead terminal are performed at 260. As shown in FIG. 9, in 260, the circuit board 30 is disposed on the circuit setting part 13c of the inverter housing 13. Concurrently, the lead terminal 42 of the electric component 40, whose main body section 41 has been disposed inside the housing recess 131 of the inverter housing 13, is inserted into the through hole 31. 260 corresponds to the terminal insertion and board placement step in the present embodiment.

In 260, the lead terminal 42 is guided by the guide hole 52 of the guide component 50, so that the connecting portion 42a at the tip is stably inserted into the through hole 31. As shown in FIG. 9, in the board placement step, the circuit board 30 is disposed to cover the opening of the housing recess 131, so that the lead terminal 42 is hardly visible because of the circuit board 30. However, as the lead terminal 42 is guided by the guide hole 52, the lead terminal 42 can be stably inserted into the through hole 31 even when there is variation in the position of the lead terminal 42.

Even when the axis line of the connecting portion 42a of the lead terminal 42 and the axis line of the guide hole 52 are misaligned before the insertion of the lead terminal 42, the connecting portion 42a is guided by the tapered portion 52a of the guide hole 52. The lead terminal 42 is thus guided such that the axis line of the connecting portion 42*a* substantially matches the axis line of the guide hole 52. The lead terminal 42 can be inserted into the through hole 31 stably in this way. At the time when the connecting portion 42*a* is guided by the tapered portion 52*a* and the axis line of the connecting portion 42*a* is displaced, the hardening resin 80 interposed between the inner circumferential surface of the housing recess 131 and the outer circumferential surface of the main body section 41 is not hardened yet and has fluidity. Therefore, when the axis line of the connecting portion 42*a* is displaced, the main body section 41 can also move inside the housing recess 131. Thus generation of a large stress on the connecting portion 42*a* or the proximal part 42*c* of the lead terminal 42 can be minimized. The hardening resin 80 before the hardening is a movement allowing member that allows the main body section 41 to move inside the housing recess 131.

Even when the movement of the main body section 41 inside the housing recess 131 is somewhat impeded at this time, the bent portion 42*b* of the lead terminal 42 deforms and minimizes generation of a large stress on the connecting portion 42*a* or the proximal part 42*c*. The bent portion 42*b* of the lead terminal 42 that is crank like is a bent-shaped, stress-mitigating part.

Figure 10:
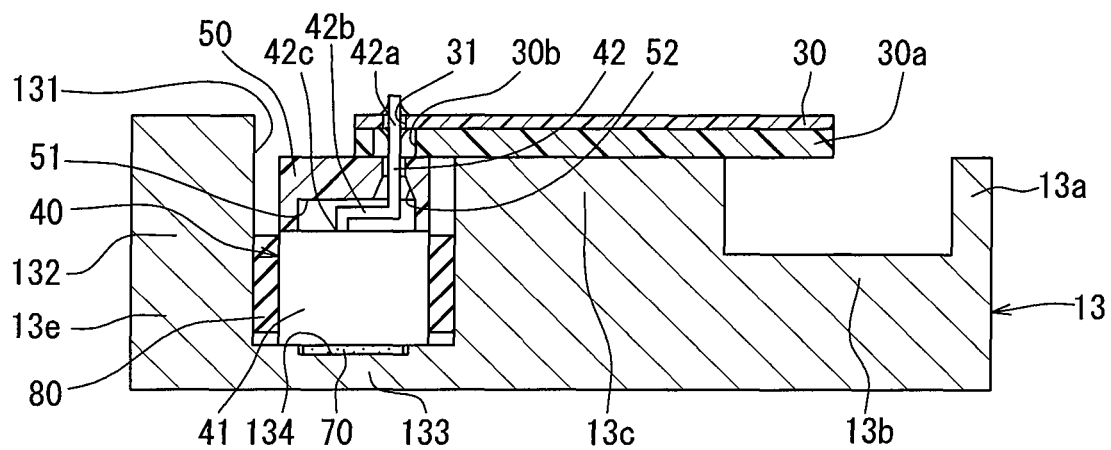
FIG. 10 is part of a cross-sectional view of one process step of forming the drive circuit section of the first embodiment.

After performing 260, a step of connecting the lead terminal is performed at 270. As shown in FIG. 10, in 270, the lead terminal 42 is soldered to be electrically connected to the conductive pattern of the circuit board 30. After performing 270, a step of hardening the liquid adhesive rubber is performed at 280. In 280, the hardening resin 80 having fluidity that has been injected in 250 is hardened so that the hardening resin 80 is bonded to the inner circumferential surface of the housing recess 131 and the outer circumferential surface of the main body section 41. Accordingly, the main body section 41 of the electric component 40 is supported on the inverter housing 13. 280 corresponds to the hardening step in the present embodiment. 240, 250, and 280 correspond to the supporting step in which the main body section 41 is attached to the case so that the main body section 41 is supported by the case.

The hardening resin 80 after the hardening step turns to a hardened rubber member with flexibility and is capable of deflection. Therefore, when the lead terminal 42 undergoes distortion after the hardening step or during use of the device due to vibration applied thereto or heat deformation, the main body section 41 moves inside the housing recess 131 and can minimize generation of an excessive stress on the connecting portion 42*a* or the proximal part 42*c*. The hardening resin 80 in the example makes a flexible member even after the hardening and functions as a movement allowing member that allows the main body section 41 to move inside the housing recess 131.

Even when the movement of the main body section 41 inside the housing recess 131 is somewhat impeded after the hardening step or during use of the device due to vibration applied thereto or heat deformation, the bent portion 42*b* minimizes generation of an excessive stress on the connecting portion 42*a* or the proximal part 42*c*. The bent portion 42*b* of the lead terminal 42 in the case also functions as a stress-mitigating part.

With the configuration of the electric device of the present embodiment described above, the following effects can be achieved.

The electric device of the present embodiment has the inverter housing 13 and the cover 14 that configure a case. The device also includes the electric component 40 inside the case, the component having the main body section 41 and the lead terminal 42 extending from the main body section 41, the main body section 41 being supported on the case. The device also includes the circuit board 30 inside the case, the circuit board having the through hole 31 in which the lead terminal 42 is inserted. In addition, the device includes the guide component 50 that has the guide hole 52 positioned relative to the through hole 31, the lead terminal 42 being inserted through the guide hole 52.

With this configuration, when the lead terminal 42 of the electric component 40 whose main body section 41 is supported on the case is inserted into the through hole 31 of the circuit board 30, the lead terminal 42 can be guided by the guide hole 52 that has been positioned relative to the through hole 31. Therefore, the lead terminal 42 of the electric component 40 whose main body section 41 is supported on the case can be inserted easily into the through hole 31 of the circuit board 30. The guide component 50 is an aligning component that adjusts the center of the lead terminal 42, and the guide hole 52 is an aligning hole.

The case has the housing recess 131 that is recessed to accommodate the main body section 41 inside and open on the side on which the lead terminal 42 extends out from the main body section 41. The circuit board 30 is disposed in the case to cover the opening of the housing recess 131.

With this configuration, even in the compact configuration in which the main body section 41 of the electric component 40 is accommodated inside the housing recess 131 of the case, with the circuit board 30 covering the opening of the housing recess 131, the lead terminal 42 can be inserted into the through hole 31 of the circuit board 30 easily.

When the circuit board 30 covers the opening of the housing recess 131, the lead terminal 42 is blocked by the circuit board 30 and its distal end is hardly visible. Even though the distal end position of the lead terminal 42 is hardly recognizable, the terminal can be easily inserted into the through hole 31 of the circuit board 30 by guiding the lead terminal 42 with the guide hole 52.

Figure 13:
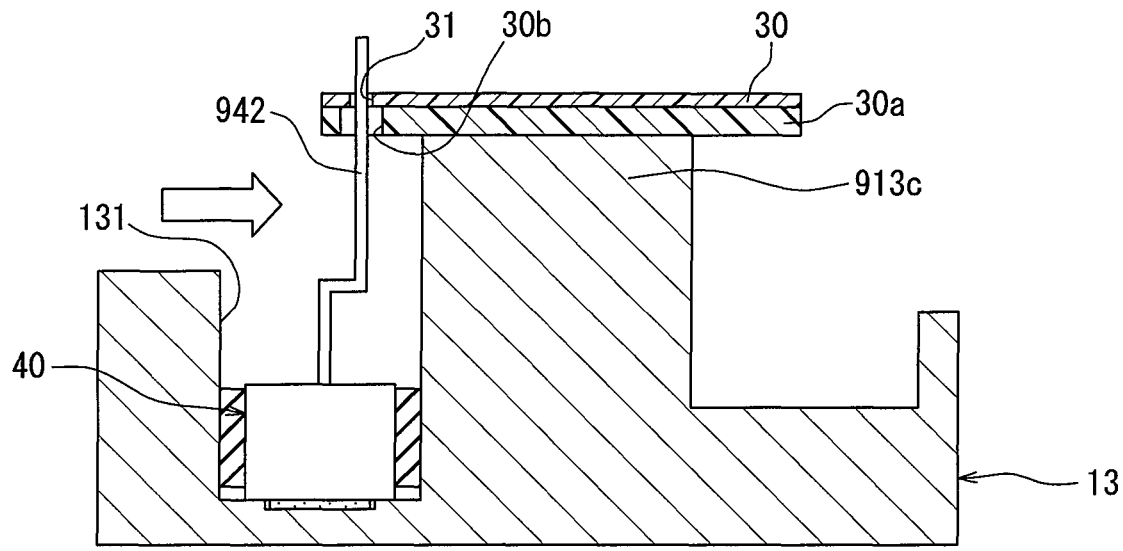
FIG. 13 is part of a cross-sectional view of one process step of forming a drive circuit section of a comparative example.

In a comparative example where the guide component 50 is not used, a jig for positioning the lead terminal would have to be used, or the dimensional accuracy of the components would have to be made higher in order to connect the circuit board and the lead terminal of the electric component. When a jig is to be used for positioning the lead terminal, for example as shown in FIG. 13, the lead terminal 42 of the electric component 40 would have to be made longer to increase the distance between the main body section 41 and the circuit board 30 so as to secure the space for allowing the jig to be inserted from the direction indicated with a white arrow. As a result, the size of the circuit setting part 913*c* of the inverter housing 13 increases, which leads to the increase of the size of the drive circuit section.

In another comparative example where the dimensional accuracy of the components is to be made higher, a high degree of precision would have to be achieved for the dimensions of all of the outer shape of the electric component that is a capacitor, for example, the circuit board, the case, and others, which can readily end up being relatively expensive. Since the circuit board and the electric component are separate, it is difficult to perfectly match the position of the electric component relative to the case. There is inevitably a gap formed between the circuit board and the electric component, or between the electric component and the case. Even though the various components are produced accurately, the various components can hardly be assembled with high precision because of the gaps noted above, and can hardly be assembled together in an automated system or the like. To deal with the issue, the components can be assembled manually, for example, but this can easily lead to quality degradation and a cost increase due to an increased number of assembling steps. With the electric device of the present embodiment, the problems in the comparative examples can be avoided.

The case has the bottomed cylindrical part 13e that forms the housing recess 131 inside the case, and a coolant cooling the main body section 41 flows along the outer surface of the bottomed cylindrical part 13e. With this configuration, even in the configuration in which the main body section 41 of the electric component 40 is accommodated inside the housing recess 131 of the bottomed cylindrical part 13e so that the main body section 41 can be cooled by the coolant, the lead terminal 42 can easily be inserted into the through hole 31 of the circuit board 30.

The circuit board 30 is mounted on the same side as the main body section 41, and includes the element molded part 30a that is a heat generating component and has a lower height than the electric component 40 when mounted. The element molded part 30a and the main body section 41 are cooled by the same coolant. With this configuration, even in the configuration in which the circuit board 30 includes the element molded part 30a that has a relatively low height when mounted on the same side as the main body section 41, and the element molded part 30a and the main body section 41 are cooled by the same coolant, the lead terminal 42 can easily be inserted into the through hole 31.

Moreover, the hardening resin 80 is interposed between the inner surface of the housing recess 131 and the main body section 41, as a movement allowing member that allows movement of the main body section 41 inside the housing recess 131. The main body section 41 is supported on the case via the hardening resin 80. With this configuration, the main body section 41 is allowed to move when the lead terminal 42 is inserted into the through hole 31 of the circuit board 30, so that the possibility of an excessive stress being applied to the connecting portion between the lead terminal 42 and the circuit board 30 can be reduced.

The hardening resin 80 is a flexible member capable of deflection. Therefore, with this flexible member being interposed between the inner surface of the housing recess 131 and the main body section 41 of the electric component 40, the main body section 41 can be allowed to move easily.

The hardening resin 80 is a hardening resin member that is obtained by hardening a resin having fluidity, and when the hardening resin member has fluidity, the hardening resin 80 allows the main body section 41 to move inside the housing recess 131. Therefore, after the hardening resin 80 having fluidity has been injected into between the inner surface of the housing recess 131 and the main body section 41 of the electric component 40, the hardening resin 80 can easily allow the main body section 41 to move, before the hardening resin 80 hardens.

The guide component 50, which is a guide member, includes a fixing pin 53 to make a fixed part that is engaged with the circuit board 30 and secured to the circuit board 30 at a position different from the through hole 31. With this configuration, the guide component 50 can be fixed to the circuit board 30 at the fixed part so as to maintain the position of the guide hole 52 set relative to the through hole 31. Therefore, the lead terminal 42 of the electric component 40 can be reliably inserted into the through hole 31.

The fixed part is secured to the circuit board 30 at a position different from the through hole 31, so that the joint between the circuit board 30 and the guide component 50 can be made firm and the reliability can be increased. The guide component 50 is not only secured to the circuit board 30 at the fixed part with the fixing pin 53 but also sandwiched and supported between the circuit board 30 and the main body section 41 at the solder joint between the lead terminal 42 and the through hole 31. With such a relatively large number of support points, the vibration resistance can particularly be made higher.

The guide hole 52 has the tapered portion 52a whose diameter decreases towards the through hole 31. With this configuration, the lead terminal 42 is guided by the tapered portion 52a of the guide hole 52 and thus the lead terminal 42 can be easily inserted into the through hole 31 of the circuit board 30.

The lead terminal 42 includes the bent portion 42b as a bent-shaped, stress-mitigating part between the connecting portion 42a that is disposed inside the through hole 31 and the proximal part 42c closer to the main body section 41. With this configuration, when the lead terminal 42 undergo distortion in being inserted into the through hole 31 or after being connected to the circuit board 30, the bent portion 42b deforms to reduce the possibility of an excessive stress being applied to the connecting portion 42a or the proximal part 42c.

The bent portion 42b, which is a stress-mitigating part, has a crank-like bent shape. The stress-mitigating part in a crank shape, which is relatively easy to form, can therefore reduce the possibility of an excessive stress being applied to the connecting portion 42a or the proximal part 42c of the lead terminal 42.

The electric device of the present embodiment is united with the compression mechanism 23 that compresses the circulating refrigerant of the refrigeration cycle and the motor 20 that drives the compression mechanism 23, and constitutes a drive circuit of the motor 20. In the electric device united with the compression mechanism 23 and the motor 20 and configuring a drive circuit of the electric compressor 1, which is desired to be relatively small, the lead terminal 42 of the electric component 40 whose main body section 41 is supported on the case can be easily inserted into the through hole 31.

The electric device of the present embodiment is mounted on a vehicle. In the in-vehicle electric device that is desired to take up relatively small installation space and to have vibration resistance, the lead terminal 42 of the electric component 40 whose main body section 41 is supported on the case can be inserted easily into the through hole 31 of the circuit board 30.

With the electric device manufacturing method of the present embodiment described above, the following effects can be achieved.

The electric device manufacturing method of the present embodiment includes a positioning step in which the guide component 50 having the guide hole 52 is prepared and the guide hole 52 is positioned relative to the through hole 31. The method also includes a terminal insertion step after the positioning step. In the insertion step, the lead terminal 42 is guided with the guide hole 52 and inserted into the through hole 31. The method also includes a supporting step in which the main body section 41 is attached to the case so that the main body section 41 is supported on the case. The method further includes a board placement step after the positioning step. In the board placement step, the circuit board 30 is disposed inside the case.

With this method, when the lead terminal 42 of the electric component 40 whose main body section 41 is supported on the case in the supporting step is inserted into the through hole 31 in the terminal insertion step, the lead terminal 42 can be guided by the guide hole 52 of the guide component 50 that has been positioned relative to the through hole 31 in the positioning step. Therefore, the lead terminal 42 of the electric component 40 whose main body section 41 is supported on the case can be inserted easily into the through hole 31 of the circuit board 30 in the terminal insertion step.

The case has the housing recess 131 that is recessed to accommodate the main body section 41 and open on the side on which the lead terminal 42 extends out from the main body section 41. In the board placement step, the circuit board 30 is disposed in the case to cover the opening of the housing recess 131. With this method, it is possible to manufacture the electric device with a compact design, in which the main body section 41 of the electric component 40 is accommodated inside the housing recess 131 of the case in the supporting step, and the circuit board 30 is disposed to cover the opening of the housing recess 131 in the board placement step. Even in such a compact electric device, the lead terminal 42 can be inserted easily into the through hole 31 in the terminal insertion step.

The case has the bottomed cylindrical part 13e that forms the housing recess 131 inside, and in which a coolant cooling the main body section 41 flows along the outer surface of the bottomed cylindrical part 13e. With this method, even in the configuration in which the main body section 41 of the electric component 40 is accommodated inside the housing recess 131 of the bottomed cylindrical part 13e in the supporting step so that the main body section 41 can be cooled by the coolant, the lead terminal 42 can easily be inserted into the through hole 31 in the terminal insertion step.

In the board placement step, the circuit board 30 that is mounted on the same side as the main body section 41 and includes the element molded part 30a having a lower height than the electric component 40 when mounted is placed so that the element molded part 30a and the main body section 41 can be cooled by the same coolant. With this method, it is possible to manufacture an electric device in which the circuit board 30 that includes the element molded part 30a that has a relatively low height when mounted on the same side as the main body section 41 of the electric component 40 is placed in the board placement step so that the element molded part 30a and the main body section 41 can be cooled by the same coolant. Even in such an electric device, the lead terminal 42 of the electric component 40 can be inserted easily into the through hole 31 of the circuit board 30 in the terminal insertion step.

Moreover, in the supporting step, a movement allowing member that allows movement of the main body section 41 inside the housing recess 131 is interposed between the inner surface of the housing recess 131 and the main body section 41, so that the main body section 41 is supported on the case via the movement allowing member. With this method, the movement allowing member that is interposed between the inner surface of the housing recess 131 and the main body section 41 in the supporting step allows movement of the main body section 41 when the lead terminal 42 of the electric component 40 is inserted into the through hole 31 of the circuit board 30. Thus application of an excessive stress on the lead terminal 42 or the connecting portion between the lead terminal 42 and the circuit board 30 can be prevented.

In the supporting step, the hardening resin 80, which is a flexible member capable of deflection, is provided as a movement allowing member. With this method, a flexible member is interposed between the inner surface of the housing recess 131 and the main body section 41 of the electric component 40 in the supporting step, and thus a configuration that allows easy movement of the main body section 41 can be obtained.

The supporting step includes an injection step of injecting the hardening resin 80 having fluidity into between the inner surface of the housing recess 131 and the main body section 41, and a hardening step of hardening the hardening resin 80 after the injection step. After the injection step and before the hardening step, the hardening resin 80 serves as the movement allowing member. With this method, after the hardening resin 80 having fluidity has been injected into between the inner surface of the housing recess 131 and the main body section 41 of the electric component 40 at the injection step, and before the hardening resin 80 is hardened in the hardening step, movement of the main body section 41 can be allowed easily.

The injection step is performed before the terminal insertion step, and the hardening step is performed after the terminal insertion step. With this method, the terminal connection step can be performed after the hardening resin 80 having fluidity has been injected into between the inner surface of the housing recess 131 and the main body section 41 of the electric component 40 at the injection step, and before the hardening resin 80 is hardened in the hardening step. Thus the main body section 41 is allowed to move easily when the lead terminal 42 of the electric component 40 is inserted into the through hole 31 of the circuit board 30.

The positioning step is followed by the fixing step in which the guide component 50 is fixed to the circuit board 30 by being engaged with the circuit board 30 at a position different from the through hole 31. With this method, by fixing the guide component 50 to the circuit board 30 at the engaged part of the guide component 50 in the fixing step, the position of the guide hole 52 set relative to the through hole 31 in the positioning step can be maintained. Thus, the lead terminal 42 of the electric component 40 can be inserted reliably into the through hole 31 of the circuit board 30 in the terminal insertion step. Since the fixed part is secured to the circuit board 30 at a position different from the through hole 31 in the fixing step, the joint between the circuit board 30 and the guide component 50 can be made firm and the reliability can be increased.

The guide hole 52 that is positioned relative to the through hole 31 in the positioning step has the tapered portion 52a whose diameter decreases towards the through hole 31. With this, the lead terminal 42 of the electric component 40 is guided by the tapered portion 52a of the guide hole 52 in the terminal connection step and the lead terminal 42 can be easily inserted into the through hole 31 of the circuit board 30.

In the positioning step, the guide hole 52 is positioned relative to the through hole 31 with the use of the optical positioning device 95. With this, the position of the guide hole 52 of the guide component 50 relative to the through hole 31 of the circuit board 30 can be determined easily with the optical positioning device 95 in the positioning step.

The lead terminal 42 includes the bent portion 42b as a bent-shaped, stress-mitigating part between the connecting portion 42a that is disposed inside the through hole 31 in the terminal insertion step and the proximal part 42c closer to the main body section 41. With this method, when the lead terminal 42 undergo distortion during or after the terminal insertion step, the stress-mitigating part deforms to reduce the possibility of an excessive stress being applied to the connecting portion 42a or the proximal part 42c of the lead terminal 42. The stress-mitigating part has a crank-like bent shape. The stress-mitigating part in a crank shape, which is relatively easy to form, can reduce the possibility of an excessive stress being applied to the connecting portion 42a or the proximal part 42c of the lead terminal 42 during or after the terminal connection step.

The method further includes a unifying step of unifying the case with the compression mechanism 23 that compresses a circulating refrigerant of a refrigeration cycle and the motor 20 that drives the compression mechanism 23, and an electrical connection step of electrically connecting the circuit board 30 and the motor 20. With this method, the electric device of the present embodiment is united with the compression mechanism 23 and the motor 20 in the unifying step, and electrically connected to the motor 20 in the electrical connection step to become part of the electric compressor 1. In the electric device of the electric compressor 1 that is desired to be relatively small, the lead terminal 42 of the electric component 40 whose main body section 41 is supported on the case can be inserted easily into the through hole 31 of the circuit board 30 in the terminal insertion step.

Second Embodiment

Next, a second embodiment will be described with reference to FIG. 14 to FIG. 20.

The second embodiment is different from the previously described first embodiment in the order of steps of manufacturing the electric device. Elements similar to those of the first embodiment are given the same reference numerals and will not be described. The constituent elements given the same reference numerals as those in the drawings pertaining to the first embodiment, and other constituent elements of the second embodiment that are not described are considered to be similar to the first embodiment and to provide similar effects.

The step of assembling the drive circuit section according to the second embodiment will roughly be described with reference to the process flow illustrated in FIG. 14 and cross-sectional views of respective process steps shown in FIG. 15 to FIG. 19.

Figure 14:
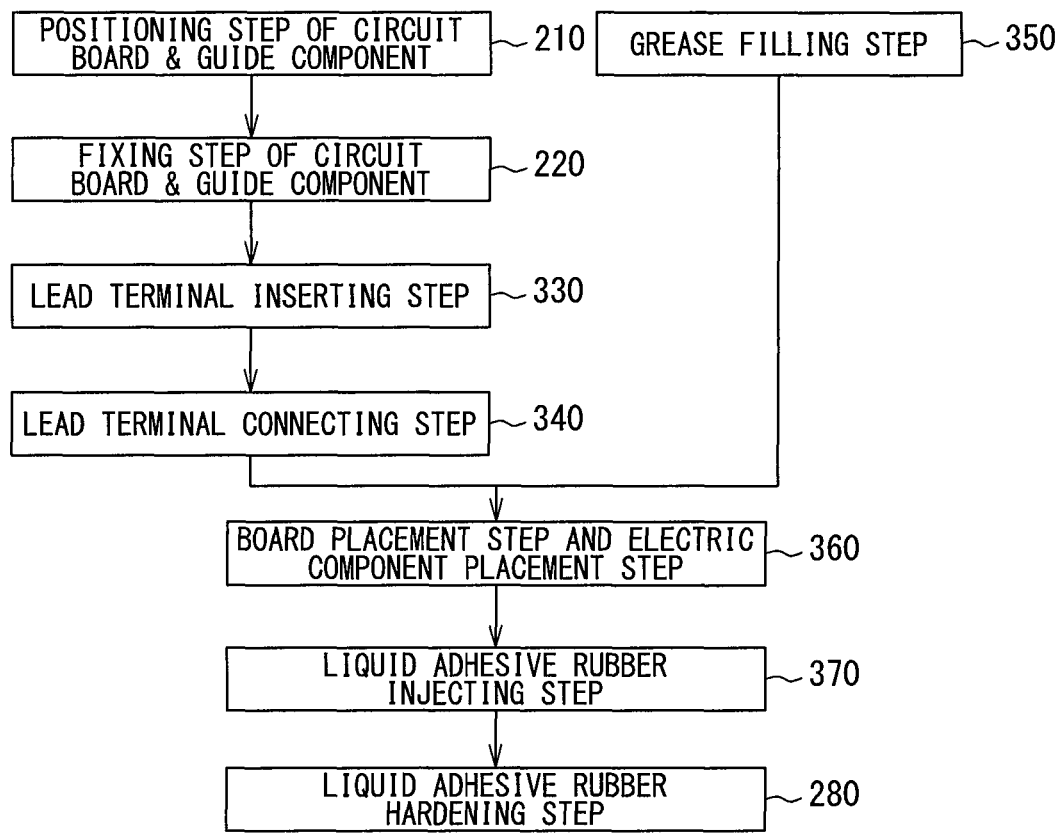
FIG. 14 is a process flowchart showing the schematic manufacturing process of a drive circuit section in a second embodiment.
Figure 15:
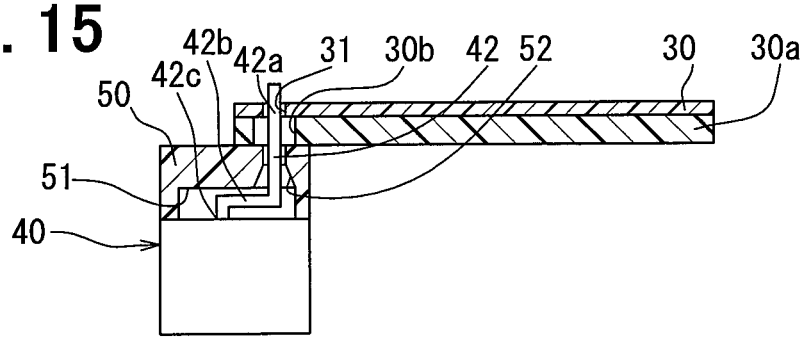
FIG. 15 is part of a cross-sectional view of one process step of forming the drive circuit section of the second embodiment.

As shown in FIG. 14, 210 and 220 are performed similarly to the first embodiment. After performing 220, a lead terminal insertion step is performed at 330. As shown in FIG. 15, in 330, the lead terminal 42 of the electric component 40 is inserted into the through hole 31 of the circuit board 30.

In 330, the lead terminal 42 is guided by the guide hole 52 of the guide component 50, so that the connecting portion 42a at the tip is stably inserted into the through hole 31. As the lead terminal 42 is guided by the guide hole 52, the lead terminal 42 can be stably inserted into the through hole 31 even when there is variation in the position of the lead terminal 42.

Figure 16:
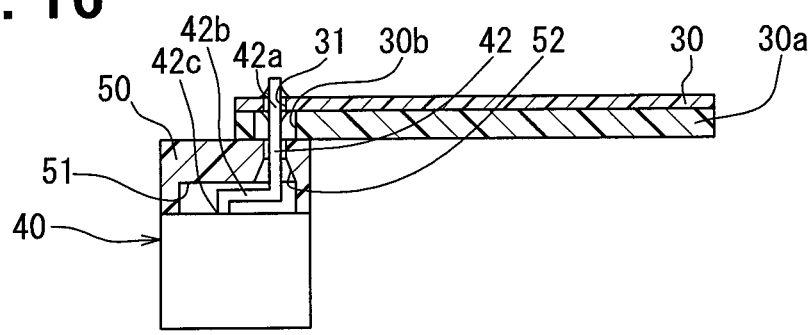
FIG. 16 is part of a cross-sectional view of one process step of forming the drive circuit section of the second embodiment.

After performing 330, a step of connecting the lead terminal is performed at 340. As shown in FIG. 16, in 340, the lead terminal 42 is soldered to be electrically connected to the conductive pattern of the circuit board 30.

Figure 17:
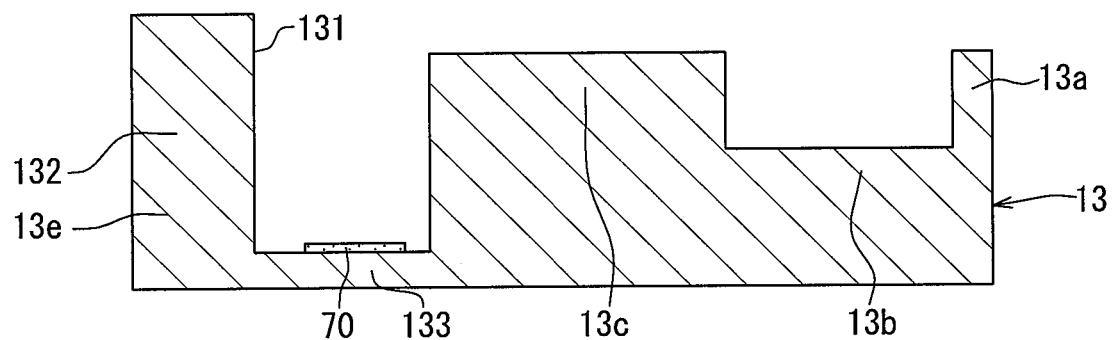
FIG. 17 is part of a cross-sectional view of one process step of forming the drive circuit section of the second embodiment.

Separately from 210, 220, 330, and 340, a grease filling step denoted at 350 is performed. As shown in FIG. 17, in 350, the heat dissipating grease 70 is injected onto the bottom surface of the housing recess 131 of the inverter housing 13. In the example, no filling recess is formed in the bottom surface of the housing recess 131.

Figure 18:
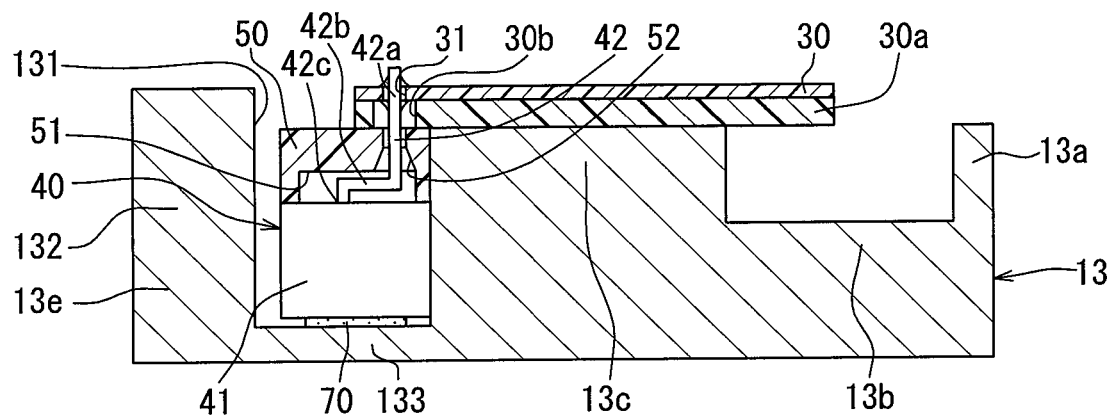
FIG. 18 is part of a cross-sectional view of one process step of forming the drive circuit section of the second embodiment.

After performing 340 and 350, a board placement step and an electric component placement step are performed at 360. As shown in FIG. 18, in 360, an assembly of the circuit board 30, the electric component 40, and the guide component 50 is disposed at a predetermined position of the inverter housing 13. More specifically, the circuit board 30 is disposed on the circuit setting part 13c of the inverter housing 13. Concurrently, the main body section 41 is disposed inside the housing recess 131 of the inverter housing 13. In 360, as shown also in FIG. 20, the main body section 41 is disposed to abut on the wall surface of the housing recess 131 on the same side as the circuit setting part 13c when viewed from the open side of the housing recess 131. At this time, the bottom surface of the main body section 41 presses the heat dissipating grease 70 in tight contact with the heat dissipating grease 70.

Figure 19:
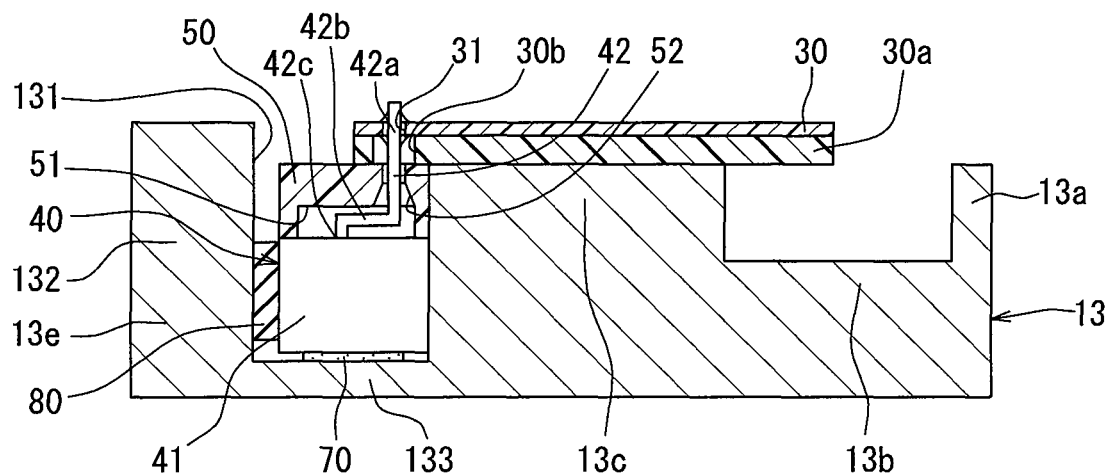
FIG. 19 is part of a cross-sectional view of one process step of forming the drive circuit section of the second embodiment.

After performing 360, a step of injecting liquid adhesive rubber is performed at 370. As shown in FIG. 19, in 370, the hardening resin 80 having fluidity before the hardening is injected into between the inner circumferential surface of the housing recess 131 and the main body section 41. The tip of a dispenser is inserted into the injection recesses 135 shown in FIG. 20, and the liquid adhesive rubber is injected into the injection recesses 135 from the tip of the dispenser. The injected liquid adhesive rubber makes tight contact with the inner circumferential surface of the housing recess 131 and the outer circumferential surface of the main body section 41.

Figure 20:
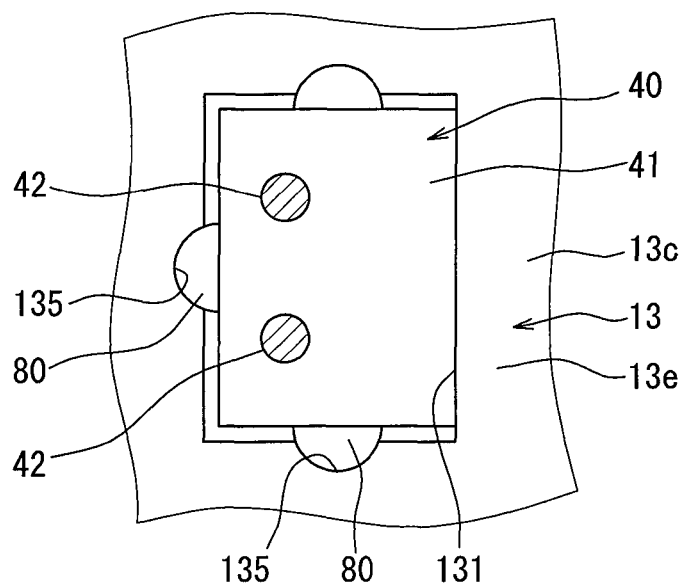
FIG. 20 is a diagram of a housing recess for accommodating the main body section of the electric component in the second embodiment viewed from the open side.

In the present embodiment, the board placement step is performed before the step of injecting the liquid adhesive rubber. As is clear also from FIG. 19, the circuit board 30 covers part of the opening of the housing recess 131, so that the liquid adhesive rubber injected into between the inner circumferential surface of the housing recess 131 and the main body section 41 can hardly be poured into the part between the circuit setting part 13c and the main body section. Thus, in 360, the main body section 41 is disposed to abut on the wall surface of the housing recess 131 on the same side as the circuit setting part 13c. The main body section 41 is in contact with the inner circumferential surface of the housing recess 131 on the same side as the circuit setting part 13c. For the reason described above, the injection recesses 135 are not provided in the inner circumferential surface of the housing recess 131 in the present embodiment on the side of the circuit setting part 13c as shown in FIG. 20. After performing 370, a step of hardening the liquid adhesive rubber is performed at 280.

210 corresponds to the positioning step in the present embodiment. 220 corresponds to the fixing step in the present embodiment. 330 corresponds to the terminal insertion step in the present embodiment. 360 corresponds to the board placement step in the present embodiment. 370 corresponds to the injection step in the present embodiment. 280 corresponds to the hardening step in the present embodiment. Steps 360, 370, and 280 correspond to the supporting step in which the main body section 41 is attached to the case so that the main body section 41 is supported by the case.

With the configuration of the electric device of the present embodiment, the effects similar to those of the first embodiment can be achieved. With the electric device manufacturing method of the present embodiment, the effects substantially similar to those of the first embodiment can be achieved.

In the electric device manufacturing method of the present embodiment, the board placement step is performed after the terminal insertion step, and the injection step and the hardening step are performed after the board placement step. With this method, after the terminal insertion step is performed to unify the circuit board 30 and the electric component 40, the board placement step is performed to accommodate the main body section 41 of the electric component 40 in the housing recess 131. After that, the hardening resin 80 having fluidity is injected into between the inner surface of the housing recess 131 and the main body section 41 of the electric component 40 in the injection step, and the hardening resin 80 is hardened in the hardening step. Thus the main body section 41 of the electric component 40 can be supported at a position where application of an excessive stress on the lead terminal 42 or the connecting portion between the lead terminal 42 and the circuit board 30 can be prevented.

Other Embodiments

While preferred embodiments of the present disclosure has been described, the present disclosure is not limited to the embodiments described above in any way, and can be embodied with various modifications without departing from the scope of the subject matter of the present disclosure. The structures in the above-described embodiments are described for illustrative purposes only, and the scope of the present disclosure shall not be limited to the scope of these descriptions. The scope of the present disclosure is set forth in the claims and shall cover the features equivalent to those described in the claims and all the changes made within the scope.

Figure 21:
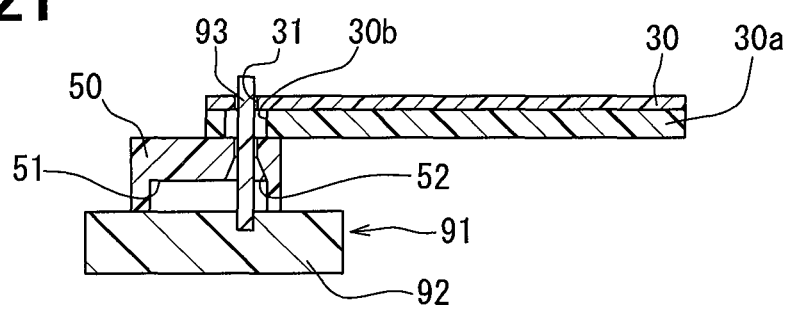
FIG. 21 is part of a cross-sectional view of one process step of forming the drive circuit section of another embodiment.

While the optical positioning device 95 is used in the positioning step in which the through hole 31 is matched with that of the guide hole 52 in the above-described embodiments, the positioning is not limited to the method. For example, as shown in FIG. 21, the guide hole 52 can be positioned relative to the through hole 31 with the use of a positioning jig 91. The positioning jig 91 includes a base 92 and a positioning pin 93 protruding from the base 92. In the positioning step, as shown in FIG. 21, the positioning pin 93 is inserted into the guide hole 52 and the through hole 31, to determine the position of the guide hole 52 relative to the through hole 31.

The positioning pin 93 has a higher rigidity than the lead terminal 42 of the electric component 40. The positioning pin 93 is fabricated in consideration of maximum dimensional tolerances of the lead terminal 42. The positioning pin 93 is fabricated in consideration of at least one of the maximum diameter tolerance of the lead terminal 42, the maximum straightness tolerance of the lead terminal 42 that indicates the degree of axial straightness of the lead terminal, and the maximum cylindricality tolerance of the outer circumferential surface of the lead terminal 42. The positioning pin 93 is made of resin or metal with a resin coating, so that the positioning pin 93 does not damage the guide component 50 and the like during the positioning step.

In the positioning step, in this way, the guide hole 52 is positioned relative to the through hole 31 with the use of the positioning jig 91 that is inserted into the guide hole 52 and the through hole 31. With this, the position of the guide hole 52 of the guide component 50 relative to the through hole 31 of the circuit board 30 can be determined easily with the positioning jig 91 in the positioning step.

The positioning step and the fixing step may be performed simultaneously. The position and shape of the fixing pin, which is the fixed part, may be made precise relative to the guide component main body so that the guide hole 52 can be positioned relative to the through hole in the step of securing the fixing pin to the circuit board. This way, there is no need to use a positioning device or a positioning jig.

Figure 22:
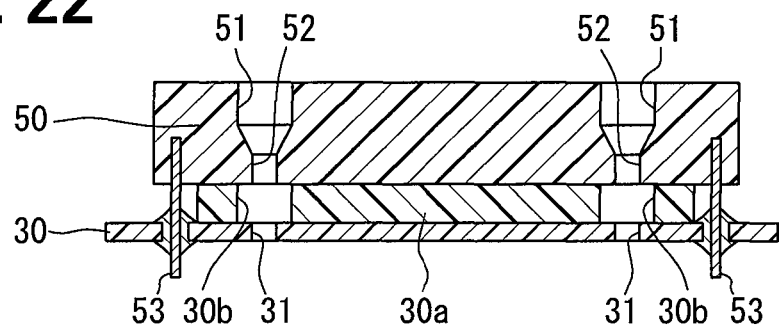
FIG. 22 is part of a cross-sectional view of one process step of forming the drive circuit section of another embodiment.
Figure 23:
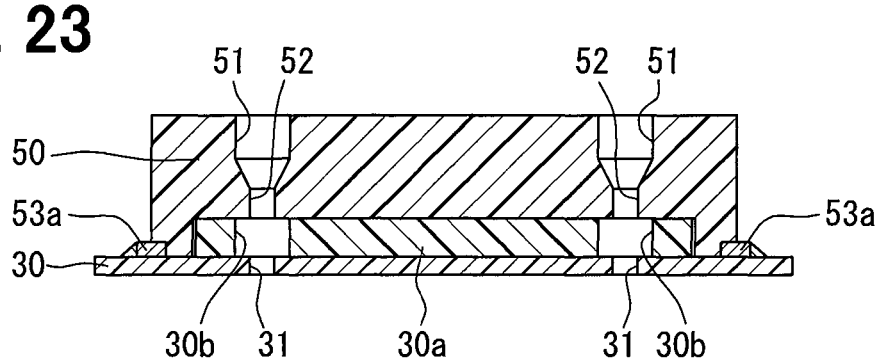
FIG. 23 is part of a cross-sectional view of one process step of forming the drive circuit section of another embodiment.
Figure 24:
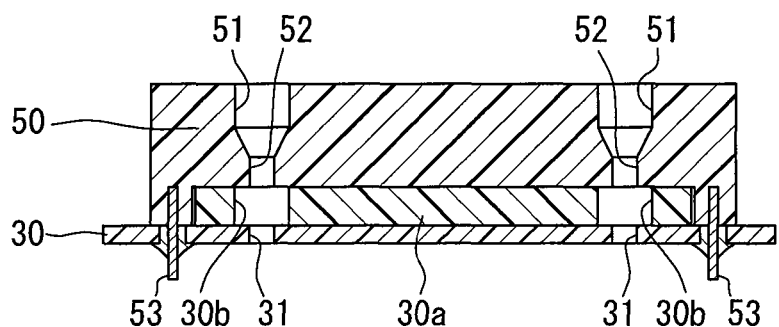
FIG. 24 is part of a cross-sectional view of one process step of forming the drive circuit section of another embodiment.
Figure 25:
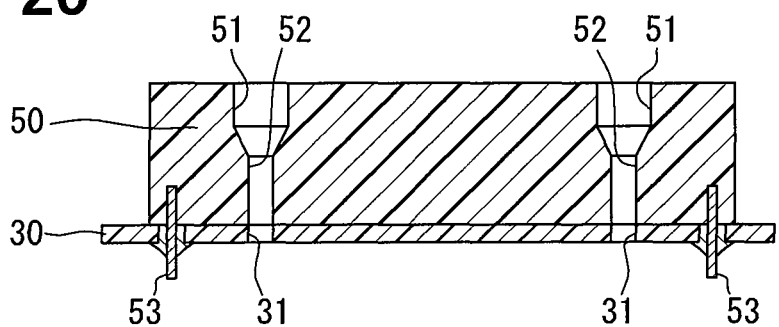
FIG. 25 is part of a cross-sectional view of one process step of forming the drive circuit section of another embodiment.

In the above-described embodiments, the fixed part of the guide member fixed to the circuit board in the fixing step has a shape illustrated in FIG. 5, but the shape is not limited to this. For example, as shown in FIG. 22, the fixing pin 53 that does not penetrate through the element molded part 30a may be soldered and fixed to the circuit board 30. Alternatively, for example, as shown in FIG. 23, a metal flanged fixing plate 53a may be provided around the main body of the guide component 50, and the fixing plate 53a may be soldered and fixed to the circuit board 30. Alternatively, for example, as shown in FIG. 24, the fixing pin 53 may be provided to protrude from a surface of the main body of the guide component 50 that is in contact with the circuit board 30, and the fixing pin 53 may be soldered and fixed to the circuit board 30. Alternatively, for example, as shown in FIG. 25, the guide component 50 may be set on a portion of the circuit board 30 where there is no element molded part 30a, and the fixing pins 53 may be soldered and fixed to the circuit board 30.

The method for fixing the fixed part of the guide member that is secured to the circuit board is not limited to soldering. The fixing may be achieved by swaging, for example. Alternatively, the fixing may be achieved by welding such as resistance welding, for example. Alternatively, the fixing may be achieved by a press-in process that uses a press-fit terminal, for example. Alternatively, the guide member may not necessarily be fixed to the circuit board.

Figure 26:
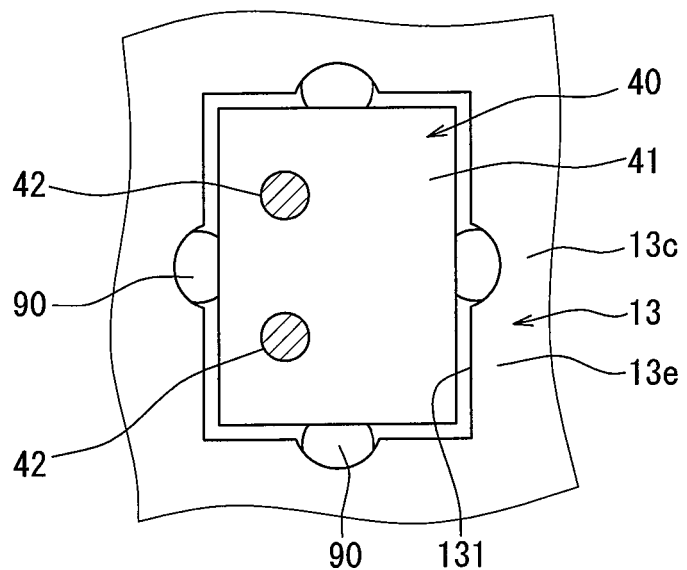
FIG. 26 is a diagram of a housing recess for accommodating the main body section of the electric component in another embodiment viewed from the open side.

While the main body section 41 is supported on the case with the hardening resin 80 being interposed in the supporting step in the above-described embodiments, the present disclosure is not limited to the embodiments. For example, as shown in FIG. 26, columnar members 90 made of solid rubber, which are flexible members, may be interposed between the inner circumferential surface of the housing recess 131 and the main body section 41 as a movement allowing member. Other than the columnar members 90 made of rubber, a rubber-made sheet member or the like that is a flexible member may be used as a movement allowing member.

Figure 27:
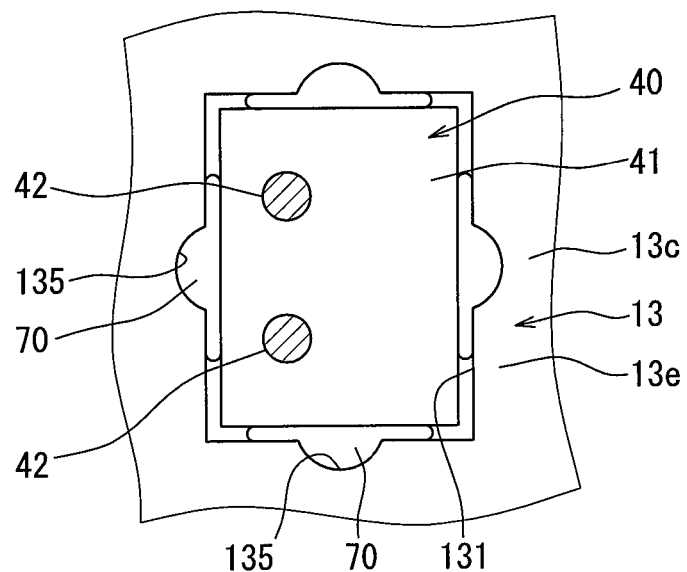
FIG. 27 is a diagram of a housing recess for accommodating the main body section of the electric component in another embodiment viewed from the open side.

The movement allowing member interposed between the inner circumferential surface of the housing recess 131 and the main body section 41 in the supporting step is not limited to a flexible member. For example, a thixotropic member having thixotropy such as grease may be used as the movement allowing member. For example, as shown in FIG. 27, the heat dissipating grease 70 that is a thixotropic member having properties known as thixotropy may be interposed between the inner circumferential surface of the housing recess 131 and the main body section 41 as a movement allowing member. The heat dissipating grease 70 interposed between the inner circumferential surface of the housing recess 131 and the main body section 41 can be the same heat dissipating grease 70 interposed between the bottom surface of the housing recess 131 and the main body section 41. The heat dissipating grease 70 injected onto the bottom surface of the housing recess 131 may be pressed by the main body section 41 and moved to between the inner circumferential surface of the housing recess 131 and the main body section 41. The heat dissipating grease 70 interposed between the inner circumferential surface of the housing recess 131 and the main body section 41 may be injected separately from the heat dissipating grease 70 interposed between the bottom surface of the housing recess 131 and the main body section 41.

In the configuration of the example described above, the movement allowing member is a thixotropic member having thixotropy. With the thixotropic member being interposed between the inner surface of the housing recess 131 and the main body section 41 of the electric component 40, the main body section 41 can be allowed to move easily when a large load is applied to the electric component 40.

In the supporting step of the method for manufacturing the electric device having the configuration in the example described above, a thixotropic member having thixotropy is provided as the movement allowing member. With the thixotropic member being interposed between the inner surface of the housing recess 131 and the main body section 41 of the electric component 40 in the supporting step, the main body section 41 can be allowed to move easily when a large load is applied to the electric component 40 during or after the supporting step.

While the main body section is supported on the case with a movement allowing member interposed between the case and the main body section of the electric component in the above-described embodiments, the present disclosure is not limited to the embodiments. The main body section may be supported on the case without using the movement allowing member.

Figure 28:
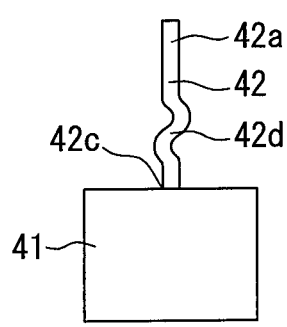
FIG. 28 is a configuration diagram of an electric component in another embodiment.

While the lead terminal 42 has the bent portion 42b that is crank like as a stress-mitigating part in the above-described embodiments, the present disclosure is not limited to the embodiments. For example, as shown in FIG. 28, a zigzag part 42d bent in a meandering manner may be used as the stress-mitigating part. In the case where the lead terminal unlikely suffers deformation, a lead terminal without a stress-mitigating part, for example a straight lead terminal, can be adopted.

Figure 29:
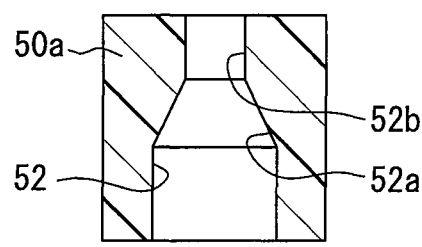
FIG. 29 is a cross-sectional view illustrating one example of a schematic configuration of a guide member in another embodiment.
Figure 30:
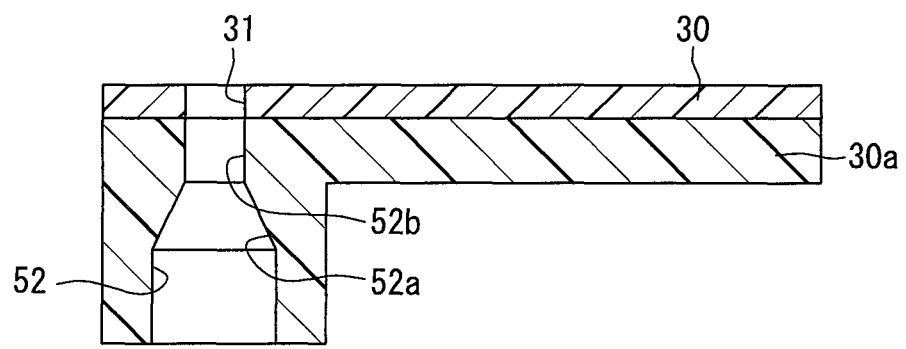
FIG. 30 is a cross-sectional view illustrating one example of a schematic configuration of a guide member in another embodiment.

While the guide component 50 that is a guide member includes the recess 51 for accommodating the bent portion 42b of the lead terminal 42 to avoid interference in the above-described embodiments, the present disclosure is not limited to the embodiments. For example, when the lead terminal is straight, or has an approximately straight shape as illustrated in FIG. 28, a guide component 50a without a recess such as the one shown in FIG. 29 may be used as the guide member. The guide member may not necessarily be a separate part from the circuit board 30. For example, as shown in FIG. 30, the element molded part 30a of the circuit board 30 and the guide member may be formed integrally.

While the guide hole 52 has the tapered portion 52a whose diameter reduces toward the through hole 31 of the circuit board 30 in the above-described embodiments, the present disclosure is not limited to the embodiments. For example, the guide hole may have an oval or rectangular shape at the end where the lead terminal is inserted, and the hole may include a guide part where the cross-sectional area gradually decreases toward the through hole and the cross-sectional shape becomes circular.

While the electric component 40 is mounted with other heat generating components on the circuit board so that the components and the board are cooled by the same coolant that is the sucked-in refrigerant in the above-described embodiments, the present disclosure is not limited to the embodiments. For example, the electric component 40 and other heat generating components may be cooled by different cooling media. Alternatively, heat generating components other than the electric component may not necessarily be mounted on the circuit board. Alternatively, the electric component may not necessarily be cooled by a coolant.

While the circuit board 30 is disposed to cover part of the opening of the housing recess 131 for accommodating the main body section 41 of the electric component 40 in the above-described embodiments, the present disclosure is not limited to the embodiments. For example, the circuit board may cover the opening of the housing recess entirely. The present disclosure will work very effectively when the circuit board covers at least part of the opening of the housing recess. The circuit board may not necessarily cover the opening of the housing recess.

While the electric device is mounted in a vehicle in the above-described embodiments, the present disclosure is not limited to the embodiments. The device may, for example, be mounted on other moving bodies. Alternatively, the electric device may be a stationary electric device.

While the electric device is the drive circuit section 3 of the electric compressor 1 in the above-described embodiments, the device is not limited to this. The electric device may, for example, be an electric device used in an electromechanical integrated device other than the electric compressor. Alternatively, the electric device may be an electric device that does not have a mechanical drive unit.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A method for manufacturing an electric device including a case, an electric component that is provided in the case and has a main body section and a lead terminal extending from the main body section, the main body section being supported on the case, and a circuit board that is provided in the case and has a connecting hole through which the lead terminal is inserted, the method comprising:
   a positioning step of preparing a guide member having a guide hole and positioning the guide hole relative to the connecting hole;
   a terminal insertion step of guiding the lead terminal with the guide hole and inserting the lead terminal into the connecting hole after the positioning step;
   a supporting step of attaching the main body section to the case and supporting the main body section on the case; and
   a board placement step of placing the circuit board in the case after the positioning step, wherein
   the case includes a housing recess that is recessed so as to accommodate the main body section and open on a side on which the lead terminal extends from the main body section,
   in the board placement step, the circuit board is placed in the case to cover the opening,
   in the supporting step,
   a movement allowing member that allows movement of the main body section inside the housing recess is interposed between an inner surface of the housing recess and the main body section,
   the main body section is supported on the case via the movement allowing member,
   the supporting step includes an injection step of injecting a hardening resin having fluidity between the inner surface of the recess and the main body section, and a hardening step of hardening the hardening resin after the injection step, and
   the hardening resin is used to function as the movement allowing member after the injection step and before the hardening step.

2. The method according to claim 1, wherein
   the case includes a bottomed cylindrical part that has an inside formed to be the housing recess, and in which a coolant cooling the main body section flows along an outer surface of the bottomed cylindrical part.

3. The method according to claim 2, wherein in the board placement step, the circuit board including a heat generating component that is mounted on a same side on which the main body section is disposed and that has a lower height than the electric component when mounted is placed, and the heat generating component and the main body section are disposed to be cooled by the coolant.

4. The method according to claim 1, wherein in the supporting step, a flexible member capable of deflection is provided as the movement allowing member.

5. The method according to claim 1, wherein the injection step is performed before the terminal insertion step, and the hardening step is performed after the terminal insertion step.

6. The method according to claim 1, wherein the board placement step is performed after the terminal insertion step, and the injection step and the hardening step are performed after the board placement step.

7. The method according to claim 1, wherein in the supporting step, a thixotropic member having thixotropy is provided as the movement allowing member.

8. The method according to claim 1, further comprising:

a fixing step of fixing the guide member to the circuit board by engaging the guide member with the circuit board at a position different from the connecting hole after the positioning step.

9. The method according to claim 1, wherein the guide hole positioned relative to the connecting hole in the positioning step has a tapered portion whose diameter reduces toward the connecting hole.

10. The method according to claim 1, wherein in the positioning step, the guide hole is positioned relative to the connecting hole with the use of an optical positioning device.

11. The method according to claim 1, wherein in the positioning step, the guide hole is positioned relative to the connecting hole with the use of a positioning jig that is inserted into the guide hole and the connecting hole.

12. The method according to claim 1, wherein the lead terminal includes a bent-shaped, stress-mitigating part between a connecting portion disposed in the connecting hole in the terminal insertion step and a proximal part closer to the main body section.

13. The method according to claim 12, wherein the stress-mitigating part has a crank-like bent shape.

14. The method according to claim 1, further comprising:

a unifying step of unifying the case with a compression mechanism that compresses a circulating refrigerant of a refrigeration cycle and an electric motor that drives the compression mechanism; and an electrical connection step of electrically connecting the circuit board and the electric motor.

* * * * *